US009520390B2

(12) United States Patent
Loechelt et al.

(10) Patent No.: US 9,520,390 B2
(45) Date of Patent: Dec. 13, 2016

(54) ELECTRONIC DEVICE INCLUDING A CAPACITOR STRUCTURE AND A PROCESS OF FORMING THE SAME

(71) Applicant: Semiconductor Components Industries, LLC, Phoenix, AZ (US)

(72) Inventors: Gary H. Loechelt, Tempe, AZ (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/168,492

(22) Filed: Jan. 30, 2014

(65) Prior Publication Data

US 2014/0264523 A1     Sep. 18, 2014

Related U.S. Application Data

(60) Provisional application No. 61/794,380, filed on Mar. 15, 2013.

(51) Int. Cl.
*H01L 29/94* (2006.01)
*H01L 21/336* (2006.01)
(Continued)

(52) U.S. Cl.
CPC ..... *H01L 27/0629* (2013.01); *H01L 27/10829* (2013.01); *H01L 27/10861* (2013.01);
(Continued)

(58) Field of Classification Search
CPC ............ H01L 27/10838; H01L 29/945; H01L 27/10867; H01L 27/10864; H01L 29/66181–29/66189; H01L 27/10861–27/1087; H01L 27/10829–27/10841; H01L 29/0878; H01L 29/41766
(Continued)

(56) References Cited

U.S. PATENT DOCUMENTS 5,309,008 A * 5/1994 Watanabe ......... H01L 27/10829
                                                    257/301
5,380,674 A * 1/1995 Kimura et al. ............... 438/241
(Continued)

OTHER PUBLICATIONS

Wolf, Stanley et al., "Silicon Processing for The VLSI Era," vol. 1: Process Technology, Copyright 1986 Lattice Press, 1986, 4 pgs.

*Primary Examiner* — Marvin Payen
*Assistant Examiner* — Jeremy Joy
(74) *Attorney, Agent, or Firm* — Abel Law Group, LLP

(57) ABSTRACT

An electronic device can include a capacitor structure. In an embodiment, the electronic device can include a buried conductive region, a semiconductor layer having a primary surface, a horizontally-oriented doped region adjacent to the primary surface, an insulating layer overlying the horizontally-oriented doped region, and a conductive electrode overlying the insulating layer. The capacitor structure can include a first capacitor electrode including a vertical conductive region electrically connected to the horizontally-oriented doped region and the buried conductive region. The capacitor structure can further include a capacitor dielectric layer and a second capacitor electrode within a trench. The capacitor structure can be spaced apart from the conductive electrode. In another embodiment, an electronic device can include a first transistor, a trench capacitor structure, and a second transistor, wherein the first transistor is coupled to the trench capacitor structure, and the second transistor does not have a corresponding trench capacitor structure.

19 Claims, 22 Drawing Sheets

(51) Int. Cl.
  *H01L 21/70*    (2006.01)
  *H01L 29/772*   (2006.01)
  *H01L 27/06*    (2006.01)
  *H01L 29/417*   (2006.01)
  *H01L 29/08*    (2006.01)
  *H01L 27/108*   (2006.01)
  *H01L 29/66*    (2006.01)
  *H01L 49/02*    (2006.01)

(52) U.S. Cl.
  CPC ........ *H01L 27/10867* (2013.01); *H01L 28/90* (2013.01); *H01L 29/0878* (2013.01); *H01L 29/41766* (2013.01); *H01L 29/66181* (2013.01); *H01L 29/945* (2013.01)

(58) Field of Classification Search
  USPC .................... 257/301, E21.651, E21.396, E27.092, 257/E29.346; 438/243–249
  See application file for complete search history.

(56) References Cited

U.S. PATENT DOCUMENTS

| | | | |
|---|---|---|---|
| 5,569,949 A | 10/1996 | Malhi | |
| 5,667,632 A | 9/1997 | Burton et al. | |
| 6,084,268 A | 7/2000 | de Frésart et al. | |
| 6,090,660 A * | 7/2000 | Noble, Jr. | H01L 27/10829 257/296 |
| 6,140,675 A * | 10/2000 | Sugiura | H01L 27/10867 257/301 |
| 6,501,129 B2 | 12/2002 | Osawa | |
| 6,545,316 B1 | 4/2003 | Baliga | |
| 6,649,975 B2 | 11/2003 | Baliga | |
| 7,276,747 B2 | 10/2007 | Loechelt et al. | |
| 7,345,342 B2 | 3/2008 | Challa et al. | |
| 7,847,350 B2 | 12/2010 | Davies | |
| 7,868,379 B2 | 1/2011 | Loechelt | |
| 7,902,017 B2 | 3/2011 | Loechelt | |
| 7,902,601 B2 | 3/2011 | Loechelt et al. | |
| 7,989,857 B2 | 8/2011 | Loechelt | |
| 8,076,716 B2 | 12/2011 | Loechelt | |
| 8,202,775 B2 | 6/2012 | Loechelt | |
| 8,298,886 B2 | 10/2012 | Loechelt et al. | |
| 8,519,474 B2 | 8/2013 | Loechelt | |
| 8,541,302 B2 | 9/2013 | Loechelt et al. | |
| 8,592,279 B2 | 11/2013 | Loechelt | |
| 9,343,528 B2 * | 5/2016 | Roig Guitart | H01L 29/0634 |
| 2005/0280085 A1 * | 12/2005 | Babcock | H01L 29/402 257/341 |
| 2006/0049455 A1 | 3/2006 | Jang et al. | |
| 2006/0065923 A1 * | 3/2006 | Pfirsch | H01L 29/0653 257/328 |
| 2006/0180947 A1 * | 8/2006 | Loechelt | H01L 21/761 257/510 |
| 2006/0214222 A1 | 9/2006 | Challa et al. | |
| 2007/0001203 A1 * | 1/2007 | Lehr | H01L 29/945 257/296 |
| 2007/0034947 A1 * | 2/2007 | Loechelt | H01L 21/761 257/341 |
| 2007/0238244 A1 * | 10/2007 | Lin | H01L 27/1087 438/243 |
| 2009/0224339 A1 * | 9/2009 | Gogoi | H01L 29/7811 257/413 |
| 2010/0090269 A1 | 4/2010 | Davies | |
| 2010/0151646 A1 * | 6/2010 | Loechelt | H01L 29/66696 438/286 |
| 2011/0045664 A1 | 2/2011 | Davies | |
| 2013/0153987 A1 | 6/2013 | Venkatraman et al. | |
| 2013/0153991 A1 | 6/2013 | Loechelt et al. | |
| 2013/0153992 A1 * | 6/2013 | Loechelt | H01L 29/78 257/330 |
| 2013/0193502 A1 * | 8/2013 | Kocon | H01L 29/7811 257/302 |
| 2014/0084143 A1 * | 3/2014 | Sakano | H01L 27/14609 250/208.1 |

* cited by examiner

ELECTRONIC DEVICE INCLUDING A CAPACITOR STRUCTURE AND A PROCESS OF FORMING THE SAME

CROSS-REFERENCE TO RELATED APPLICATION

This application claims priority under 35 U.S.C. §119(e) to U.S. Patent Application No. 61/794,380 entitled "Electronic Device Including a Capacitor Structure and a Process of Forming the Same," by Loechelt et al., filed Mar. 15, 2013, which is assigned to the current assignee hereof and incorporated herein by reference in its entirety.

FIELD OF THE DISCLOSURE

The present disclosure relates to electronic devices and processes of forming electronic devices, and more particularly to, electronic devices including capacitor structures and processes of forming the same.

RELATED ART

An insulated gate field-effect transistor (IGFET) is a common type of transistor that can be used in power switching circuits. The IGFET includes a source region, a drain region, a channel region extending between the source and drain regions, and a gate structure adjacent to the channel region. The gate structure includes a gate electrode disposed adjacent to and separated from the channel region by a gate dielectric layer.

IGFETs can be used is power switching circuits. During switching operations when using a switching circuit, voltage overshoot, voltage undershoot, ringing, or other adverse condition can affect the voltage at an output terminal of the power switching circuit. Output capacitors can help reduce the severity of such voltage swings during switching operations. Continued improvement of output capacitors and integration into process flows are desired.

BRIEF DESCRIPTION OF THE DRAWINGS

Embodiments are illustrated by way of example and are not limited in the accompanying figures.

Figure 1:
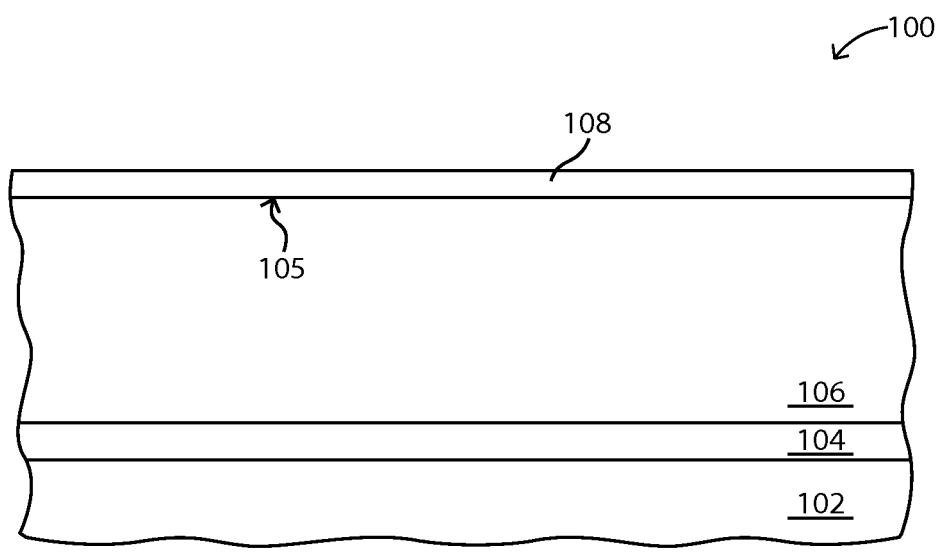
FIG. 1 includes an illustration of a cross-sectional view of a portion of a workpiece including a buried conductive region, a buried insulating layer, a semiconductor layer, and a dielectric layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, the terms "horizontally-oriented" and "vertically-oriented," with respect to a region or structure, refer to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor that is designed to normally operate with at least a 10 V difference maintained between the source and drain or emitter and collector of the transistor when the transistor is in an off-state. For example, when the transistor is in an off-state, a 10 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A capacitor structure can be incorporated within an electronic device and be electrically connected to a buried conductive region. In an embodiment, the capacitor structure can be a trench capacitor structure with a capacitor electrode along a sidewall of a trench and another capacitor electrode closer to an axial centerline of the capacitor structure. The capacitor structure can have a relatively high capacitance. In a particular embodiment, a transistor structure within the electronic device can have a current-carrying electrode electrically connected to the buried conductive region. One of the capacitor electrodes can also be a current path between the buried conductive layer and the transistor structure. Other transistor structures do not have corresponding trench capacitor structures. The process flow can be integrated such that capacitor electrodes can be formed when conductive plugs for the other transistor structures are formed. The concepts are better understood in conjunction with the figures and description that follows that merely illustrate and not limit the scope of the present invention.

A transistor in a circuit schematic can be physically implemented as a single transistor structure or as a plurality of transistor structures. In a particular implementation, the plurality of transistor structures may have their drain regions or collector regions electrically connected to each other, their gate electrodes or base regions electrically connected to each other, and their source regions or emitter regions electrically connected to each other. A transistor can be described with respect to transistor structures even though only a single transistor is illustrated or used in an embodiment. Thus, a reference to transistor structures also can also cover a single transistor structure unless explicitly stated to the contrary.

FIG. 1 includes an illustration of a cross-sectional view of a portion of a workpiece 100 that includes a buried conductive region 102, a buried insulating layer 104, a semiconductor layer 106, and a dielectric layer 108. The buried conductive region 102 can include a Group 14 element (i.e., carbon, silicon, germanium, or any combination thereof) and can be heavily n-type or p-type doped. For the purposes of this specification, heavily doped is intended to mean a peak dopant concentration of at least approximately $1 \times 10^{19}$ atoms/cm$^3$, and lightly doped is intended to mean a peak dopant concentration of less than approximately $1 \times 10^{19}$ atoms/cm$^3$. The buried conductive region 102 can be a portion of a heavily doped substrate (e.g., a heavily n-type doped wafer) or may be a buried doped region disposed over a substrate of opposite conductivity type or over another buried insulating layer (not illustrated) that is disposed between a substrate and the buried conductive region 102. In an embodiment, the buried conductive region 102 is heavily doped with an n-type dopant, such as phosphorus, arsenic, antimony, or any combination thereof. In a particular embodiment, the buried conductive region 102 includes arsenic or antimony if diffusion of the buried conductive region 102 is to be kept low, and in a particular embodiment, the buried conductive region 102 includes antimony to reduce the level of autodoping (as compared to arsenic) during formation of a subsequently-formed semiconductor layer. The buried conductive region 102 will be used to electrically connect a drain of a transistor structure and a capacitor electrode of a capacitor structure to another portion of the electronic device.

The buried insulating layer 104 is disposed over the buried conductive region 102. During normal operation, the buried insulating layer 104 helps to isolate the voltage on the buried conductive region 102 from portions of the semiconductor layer 106. The buried insulating layer 104 can include an oxide, a nitride, or an oxynitride. The buried insulating layer 104 can include a single film or a plurality of films having the same or different compositions. The buried insulating layer 104 can have a thickness in a range of at least approximately 0.2 micron or at least approximately 0.3 micron. Further, the buried insulating layer 104 may have a thickness no greater than approximately 5.0 microns or no greater than approximately 2.0 microns. In a particular embodiment, the buried insulating layer 104 has a thickness in a range of approximately 0.5 micron to approximately 0.9 micron. The buried insulating layer 104 is not required, and in another embodiment, the semiconductor layer 106 can be formed on the buried conductive region 102.

The semiconductor layer 106 is disposed over the buried insulating layer 104 and has a primary surface 105 where the transistors and other electronic components (not illustrated) are formed. The semiconductor layer 106 can include a Group 14 element and any of the dopants as described with respect to the buried conductive region 102 or dopants of the opposite conductivity type. In an embodiment, the semiconductor layer 106 is a lightly doped n-type or p-type epitaxial silicon layer having a thickness in a range of approximately 0.2 micron to approximately 5.0 microns, and a doping concentration no greater than approximately $1 \times 10^{17}$ atoms/$cm^3$, and in another embodiment, a doping concentration of at least approximately $1 \times 10^{14}$ atoms/$cm^3$. The semiconductor layer 106 may be disposed over all of the workpiece 100. The dopant concentration within the semiconductor layer 106 as formed or before selectively doping regions within the semiconductor layer 106 will be referred to as the background dopant concentration.

The dielectric layer 108 can be formed over the semiconductor layer 106 using a thermal growth technique, a deposition technique, or a combination thereof. The dielectric layer 108 can include an oxide, a nitride, an oxynitride, an organic dielectric, or any combination thereof. In an embodiment, the dielectric layer 108 includes an oxide and has a thickness in a range of approximately 11 nm to approximately 50 nm.

Figure 2:
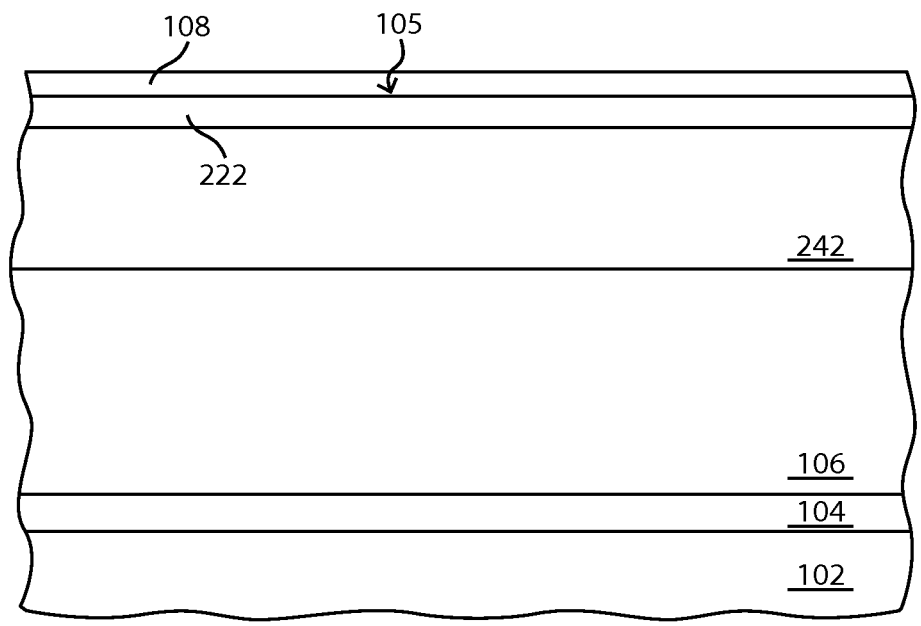
FIG. 2 includes an illustration of a cross-sectional view of the workpiece of FIG. 1 after forming a horizontally-oriented doped region and a resurf region.

FIG. 2 illustrates the workpiece after forming horizontally-oriented doped regions 222 and resurf regions 242, wherein one of each is illustrated in FIG. 2. Within a power transistor being formed, the horizontally-oriented doped regions 222 can be at least part of a drain region of a transistor. In a normal operating state, the charge carriers (for example, electrons) or current flows through the horizontally-oriented doped regions 222 principally in a horizontal direction. The horizontally-oriented doped regions 222 can have a dopant concentration of less than approximately $1 \times 10^{19}$ atoms/$cm^3$ and at least approximately $1 \times 10^{16}$ atoms/$cm^3$ and a depth in one embodiment of less than approximately 0.9 micron, and in another embodiment of less than approximately 0.5 micron. In a particular embodiment, the horizontally-oriented doped regions 222 are n-type doped.

The resurf regions 242 can help keep more current flowing through the horizontally-oriented doped regions 222 instead of into the semiconductor layer 106 underlying the horizontally-oriented doped regions 222. The resurf regions 242 may have a dopant concentration of no greater than approximately $5 \times 10^{17}$ atoms/$cm^3$ and at least approximately $1 \times 10^{16}$ atoms/$cm^3$, and a depth in one embodiment of less than approximately 1.5 microns, and in another embodiment of less than approximately 1.2 microns. The peak concentration of the resurf regions 242 may be in a range of approximately 0.5 micron to approximately 0.9 micron below the primary surface 105. In a particular embodiment, the resurf regions 242 are p-type doped.

In an embodiment, the horizontally-oriented doped regions 222 can be formed before the resurf regions 242. In another embodiment, the horizontally-oriented doped regions 222 can be formed after the resurf regions 242.

Figure 3:
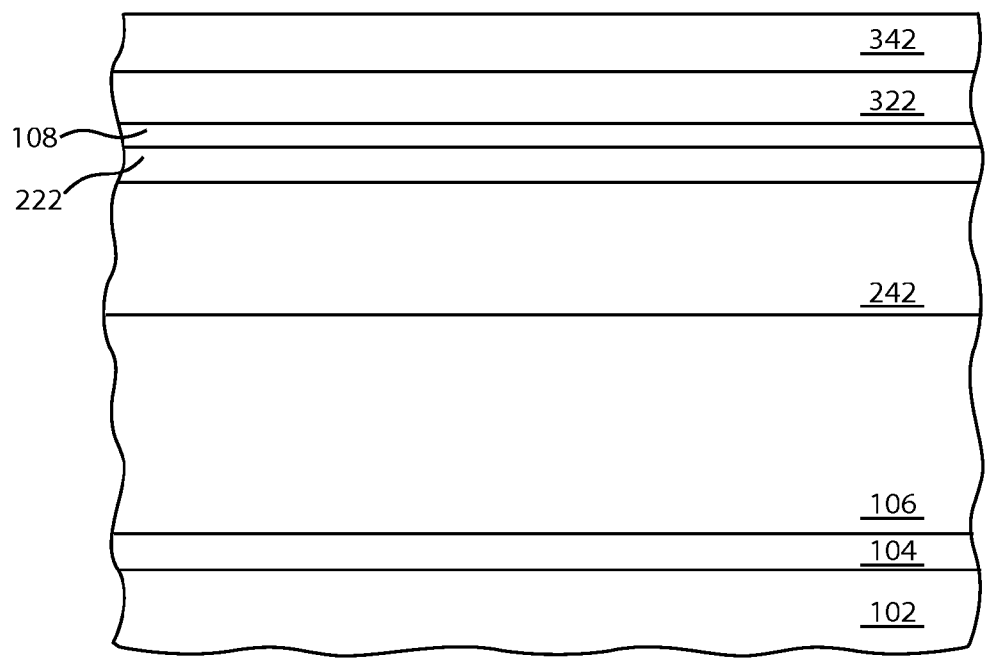
FIG. 3 includes an illustration of a cross-sectional view of the workpiece of FIG. 2 after forming an insulating layer and a conductive layer.

FIG. 3 includes an illustration after forming an insulating layer 322 and a conductive layer 342. The insulating layer 322 can formed using a thermal growth technique, a deposition technique, or a combination thereof. The insulating layer 322 can include an oxide, a nitride, an oxynitride, or any combination thereof. In an embodiment, the insulating layer 322 includes a nitride and has a thickness in a range of approximately 20 nm to approximately 90 nm. The conductive layer 342 is deposited over the insulating layer 322. The conductive layer 342 includes a conductive material or may be made conductive, for example, by doping. More particularly, the conductive layer 342 can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer 342 has a thickness in a range of approximately 0.05 micron to approximately 0.5 micron. In a particular embodiment, the conductive layer 342 will be used to form a conductive electrode that can help to reduce drain-to-gate capacitance.

Figure 4:
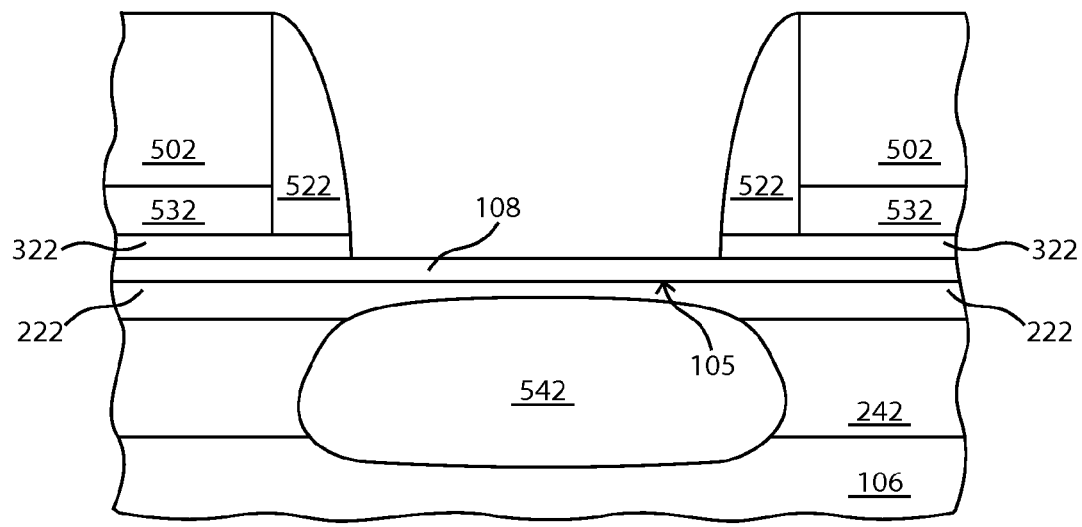
FIG. 4 includes an illustration of a cross-sectional view of the workpiece of FIG. 3 after forming insulating members, patterning the conductive layer to form a patterned conductive layer, and forming insulating sidewall spacers and a deep body doped region.
Figure 5:
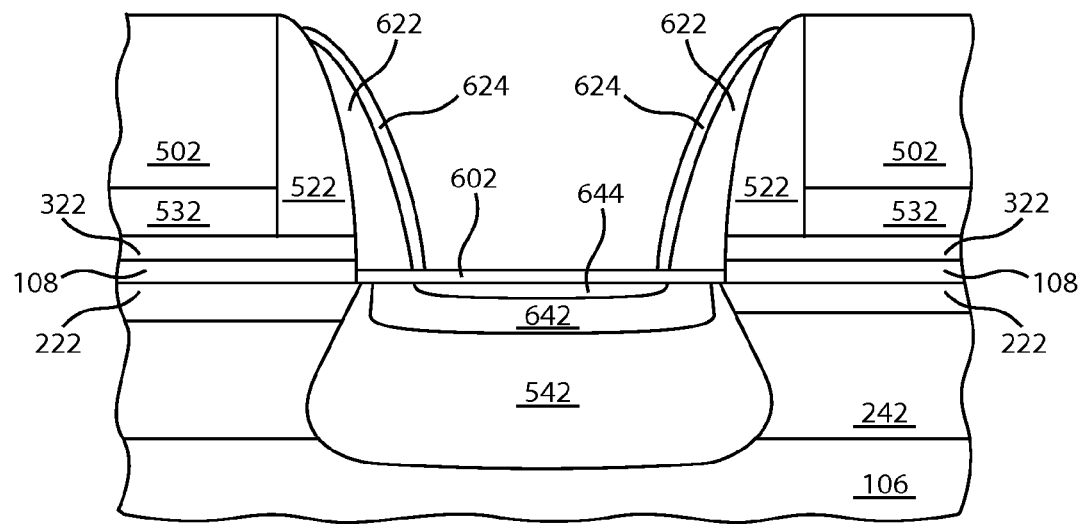
FIG. 5 includes an illustration of a cross-sectional view of the workpiece of FIG. 4 after forming a body region, gate electrodes, an insulating layer, and a source region.

FIG. 4 includes an illustration after forming an insulating layer 502, patterning the insulating layer 502, patterning the conductive layer 342 to form patterned conductive layer 532, and forming insulating spacers 522 and deep body doped regions 542, one of which is illustrated in FIG. 5. The insulating layer 502 can include one or more insulating films. In the embodiment as illustrated in FIG. 4, an insulating layer 502 is deposited over the conductive layer 342. The insulating layer 502 can include an oxide, a nitride, any oxynitride, or an organic dielectric. The insulating layer 502 has a thickness in a range of approximately 0.2 micron to approximately 2.0 microns.

A masking layer (not illustrated) is formed over the insulating layer 502 and patterned to define openings where the transistor structures are being formed. Portions of the conductive layer 342 are patterned, and the masking features are removed. Remaining portions of the conductive layer 342 are the patterned conductive layer 532. The insulating spacers 522 are formed along the sidewalls of the patterned conductive layer 532 and the insulating layer 502. In a particular embodiment, the insulating spacers 522 include a nitride and are formed by depositing a nitride layer to a thickness in a range of approximately 20 nm to approximately 90 nm and anisotropically etching the nitride layer to form the insulating spacers 522. Openings defined by the insulating spacers 522 are disposed over portions of the semiconductor layer 106 where deep body doped regions 542 and source and channel regions will be formed.

The deep body doped regions 542 can provide alternative paths during avalanche breakdown between the drain regions of the transistor structures and the deep body doped regions 542 as opposed to avalanche breakdown between the drain regions and subsequently-formed channel regions. In an embodiment, the peak concentration of the deep body doped regions 542 is at least approximately 0.1 micron deeper than the peak concentration of the channel region, and in another embodiment, the peak concentration of the deep body doped regions 542 is no greater than approximately 0.9 micron deeper than the peak concentration of the channel region. In a further embodiment, the peak concentration of the deep body doped regions 542 is in a range of approximately 0.6 micron to approximately 1.1 microns below the primary surface 105. The deep body doped regions 542 can be formed using a single implant or a combination of implants. The deep body doped regions 542 may or may not contact the buried insulating layer 104. For a single implant or for the implant (of a combination of implants) having the lowest projected range, the dose can be in a range of approximately $5\times10^{13}$ ions/cm$^2$ to approximately $5\times10^{14}$ ions/cm$^2$.

FIG. 5 includes an illustration of the workpiece after forming a gate dielectric layer 602, gate electrodes 622, an insulating layer 624 along exposed surfaces of the gate electrodes 622, body regions 642, and source regions 644, in which FIG. 5 illustrates one of each of the body regions 642 and the source regions 644. The body regions 642 may include channel regions for the transistor structures. The body regions 642 have the same conductivity type as the channel regions and the deep body doped regions 542 and can have a peak dopant concentration of at least approximately $1\times10^{18}$ atoms/cm$^3$. In another embodiment, not illustrated, channel regions for the transistor structures may be formed separately. Such channel regions can be formed by ion implantation with a dose in a range of approximately $5\times10^{12}$ ions/cm$^2$ to approximately $5\times10^{13}$ ions/cm$^2$. The energy can be selected to achieve a projected range of approximately 0.05 micron to approximately 0.3 micron.

The exposed portion of the dielectric layer 108 is removed by etching, and the gate dielectric layer 602 is formed over the exposed surface along the bottoms of the openings. In a particular embodiment, the gate dielectric layer 602 includes an oxide, a nitride, an oxynitride, or any combination thereof and has a thickness in a range of approximately 5 nm to approximately 50 nm. The gate electrodes 622 are disposed over the gate dielectric layer 602 and are spaced apart and electrically isolated from the patterned conductive layer 532. The gate electrodes 622 can be formed by depositing a layer of material that is conductive as deposited or can be subsequently made conductive. The layer of material can include a metal-containing or semiconductor-containing material. In an embodiment, the layer is deposited to a thickness of approximately 0.1 micron to approximately 0.5 micron. The layer of material is etched to form the gate electrodes 622. In the illustrated embodiment, the gate electrodes 622 are formed without using a mask and have shapes of sidewall spacers. The widths of the gate electrodes 622 at their bases are substantially the same as the thickness of the layer as deposited.

The insulating layer 624 can be thermally grown from the gate electrodes 622 or may be deposited over the workpiece. The thickness of the insulating layer 624 can be in a range of approximately 10 nm to approximately 30 nm. The source regions 644 are formed from portions of the body regions 642. Each of the source regions 644 can include extension portions and a heavily doped portion. The extension portions can have a dopant concentration higher than approximately $5\times10^{17}$ atoms/cm$^3$ and less than approximately $5\times10^{19}$ atoms/cm$^3$. If needed or desired, an additional set of insulating spacers (not illustrated) may be formed before forming the heavily doped portions of the source regions 644. Such insulating spacers are formed to cover the extension portions of the source regions 644 and to displace the heavily doped portions further from the gate electrodes 622. The insulating spacers can be formed by depositing an insulating layer and anisotropically etching the insulating layer. The insulating spacers can include an oxide, a nitride, an oxynitride, or any combination thereof, and have widths at the bases of the insulating spacers in a range of approximately 50 nm to approximately 200 nm.

The doping for the heavily doped portions of the source regions 644 can be performed after the insulating layer 624 is formed. The heavily doped portions of the source regions 644 allow ohmic contacts to be subsequently made and have a dopant concentration of at least approximately $1\times10^{19}$ atoms/cm$^3$. The source regions 644 can be formed using ion implantation, have an opposite conductivity type as compared to the body regions 642, and the same conductivity type as the horizontally-oriented doped regions 222 and the buried conductive region 102.

The workpiece includes many transistor structures similar to the one illustrated in FIG. 5. The horizontally-oriented doped regions will be electrically connected to the buried conductive region 102 by subsequently-formed vertical conductive regions. In the subsequently figures, different parts of the workpiece are illustrated to understand better the integration techniques to achieve transistor structures that are electrically connected to trench capacitor structures and other transistor structures that are not electrically connected to trench capacitor structures.

Figure 6:
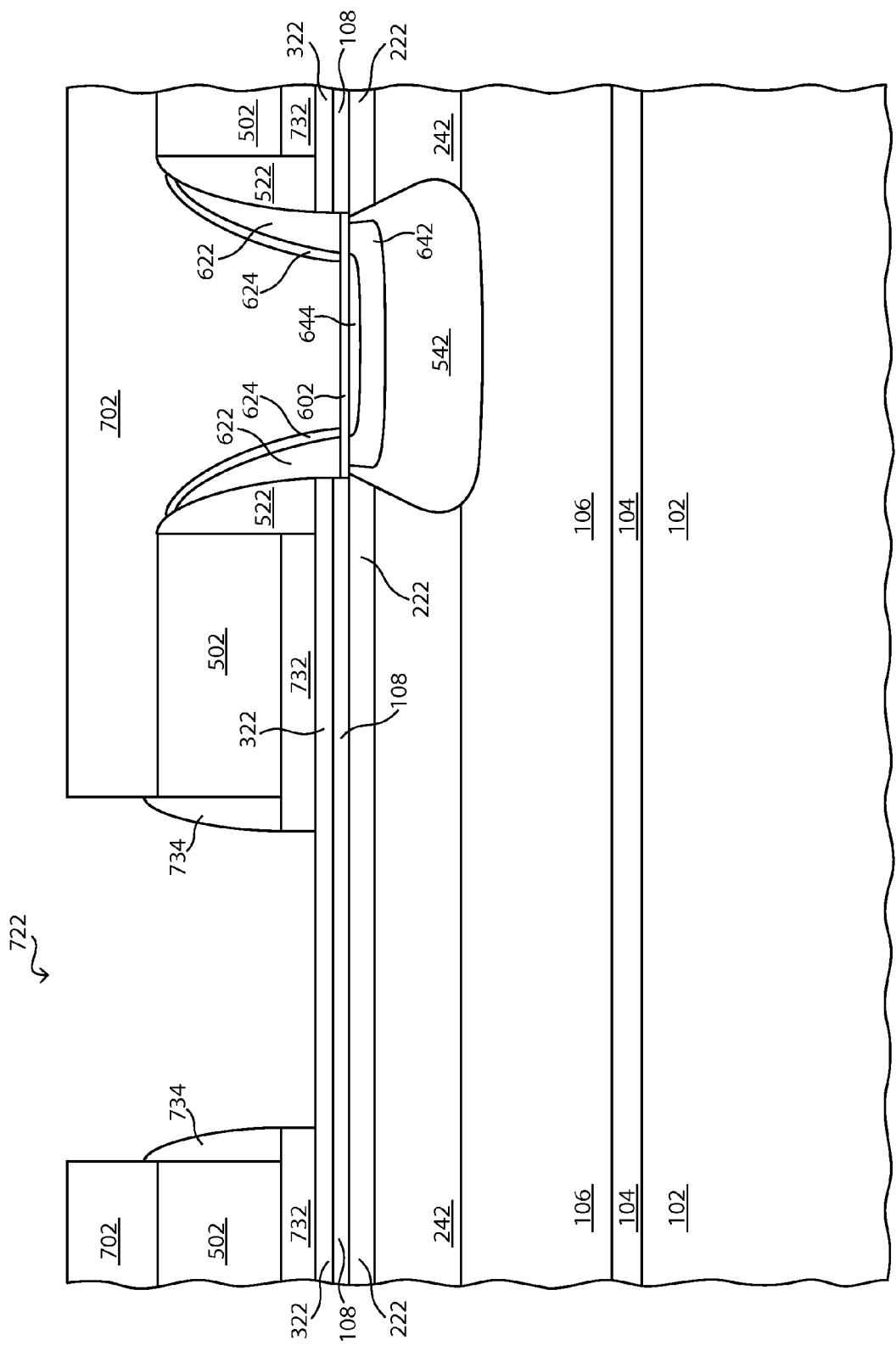
FIGS. 6 and 7 include illustrations of cross-sectional views of the workpiece of FIG. 5 after forming an ILD layer, patterning the ILD layer and insulating layer to define openings, and forming conductive electrode members within the openings.
Figure 7:
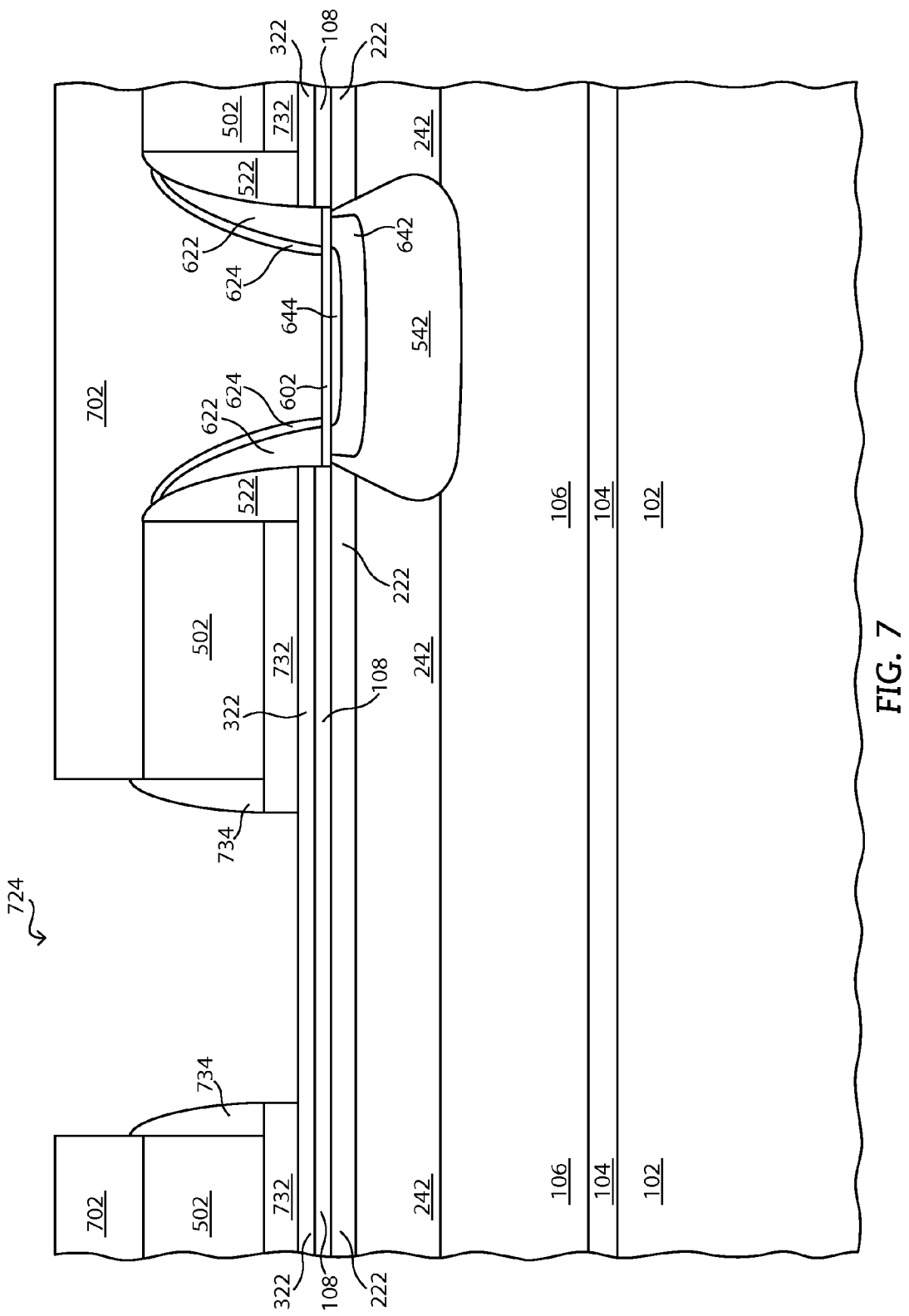

FIGS. 6 and 7 include illustrations of the workpiece after forming an interlevel dielectric (ILD) layer 702, patterning the ILD layer 702 to define openings 722 and 724, and forming conductive electrode members 732 and 734. FIGS. 6 and 7 illustrate one of each of the openings 722 and 724. Other openings similar to the openings 722 and 724 may be formed at other locations in the workpiece. FIG. 6 corresponds to a portion of the workpiece where a trench capacitor structure will be subsequently formed adjacent to the transistor structure, and FIG. 7 corresponds to a portion of the workpiece where a vertical conductive region will be subsequently formed adjacent to another transistor structure. The transistor structures in FIGS. 6 and 7 are substantially identical to each other. In another embodiment (not illustrated), the transistor structures may be different. For example, the source regions 644 of such transistors may be electrically connected to buried conductive region 102 using a vertical conductive structure that is formed relatively early in the process flow.

The ILD layer 702 can include an oxide, a nitride, an oxynitride, an organic dielectric, or any combination thereof. The ILD layer 702 can include a single film having a substantially constant or changing composition (e.g., a high phosphorus content further from the semiconductor layer 106) or a plurality of discrete films. An etch-stop film, an antireflective film, or a combination may be used within or over the ILD layer 702 to help with processing. The ILD layer 702 can be deposited to a thickness in a range of approximately 0.5 micron to approximately 2.0 microns. The ILD layer 702 may be planarized to improve process margin during subsequent processing operations (for example, lithography, subsequent polishing, or the like).

A patterned masking layer (not illustrated) is formed over the ILD layer 702. Portions of the ILD layer 702 and the insulating layer 502 are patterned to define openings 722 and 724, as illustrated in FIGS. 6 and 7. The opening 722 is significantly wider than the opening 724, as a trench capacitor structure will be subsequently formed under the opening 722. The patterned masking layer may be removed after the ILD layer 702 is patterned to define the openings 722 and 724 that initially extend to the patterned conductive layer 532 (illustrated in FIG. 5). Below is a more detailed discussion of considerations when determining widths of the openings 722 and 724. After reading this specification, skilled artisans will appreciate the information provides guidance and does not limit the concepts as described herein.

Referring to FIG. 6, the opening 722 has a width such that the layers for the trench capacitor structure can be formed within the subsequently formed trench. The conductive electrode members 734 and a subsequently-formed insulating layer (not illustrated in FIG. 6) will be disposed within the opening 722. The thicknesses of layers used to form the capacitor structures can be used at least in part to define the widths of the subsequently-formed trenches. In an embodiment, the opening 722 has a width of at least 0.7 micron, and in another embodiment, the opening 722 has a width of at least 1.1 micron. The maximum width of the opening 722 is determined more by practical considerations than by theoretical limits. A wider trench occupies more space and can reduce the number of components that can be formed using the workpiece. If the inner capacitor electrode (closer to a central axis of the subsequently-formed trench) is to fill the trench, more material for a conductive layer used to form the inner capacitor electrode may be needed, and the removal of such conductive layer will take longer. If the conductive layer does not completely fill the trench, a subsequently-formed contact opening may need to extend far within the trench and require a separate masking and etch sequence as compared to other contact openings. In an embodiment, the opening 722 may have a width no greater than approximately 5 microns, and in another embodiment, the opening 722 may have a width no greater than approximately 4 microns. In a particular embodiment, the opening 722 has a width in a range of approximately 1.5 microns to approximately 3 microns.

Referring to FIG. 7, a trench capacitor structure is not being formed under the opening 724, and thus, the opening 724 is significantly narrower than the opening 722. The conductive electrode members 734 and a subsequently-formed insulating layer (not illustrated in FIG. 7) will be disposed within the opening 724 and can be used to define the width of the subsequently-formed trench. In one embodiment, the opening 724 can have a width of at least approximately 0.5 micron, and in another embodiment, the opening 724 can have a width of at least approximately 0.8 micron. If the opening 724 is too wide, a trench capacitor structure will be formed within the subsequently-formed trench that will underlie the opening 724. In an embodiment, the opening 724 may be no greater than 3.0 microns, and in another embodiment, the opening may be no greater than approximately 2.5 microns. In a particular embodiment, the opening 724 has a width in a range of approximately 1.1 microns to approximately 2.0 microns.

After the openings 722 and 724 have been defined, a conductive layer is formed over the ILD layer 702 and within the openings 722 and 724. The conductive electrode members 734 are formed along the sidewalls of the openings, and the patterned conductive layer 532 is etched to form conductive electrode members 732 as illustrated in FIGS. 6 and 7. The conductive electrode members 734 can allow for a more simplified process flow, more process margin, or both, as subsequently-formed contact openings may be made to the conductive electrode members 734 and such contact openings do not need to extend to the conductive electrode members 732. The conductive electrode members 734 can be formed by depositing a layer of any of the materials as previously described with respect to the conductive layer 342. The layer for the conductive electrode members 734 and the conductive layer 342 can have the same composition or different compositions. The layer for the conductive electrode members 734 fills only part, and not all, of the openings 722 and 724 and can have a thickness in a range of approximately 50 nm to approximately 400 nm. The layer is anisotropically etched to remove portions of the layer overlying the ILD layer 702. The etch can be continued to recess the uppermost points of the conductive electrode members 734 within the openings 722 and 724 and to etch the patterned conductive layer 532 to form the conductive electrode members 732. The conductive electrode members 732 and 734 abut each other, and combinations of the conductive electrode members 732 and 734 form conductive electrodes that help to reduce drain-to-gate capacitance for the transistor structures.

Figure 8:
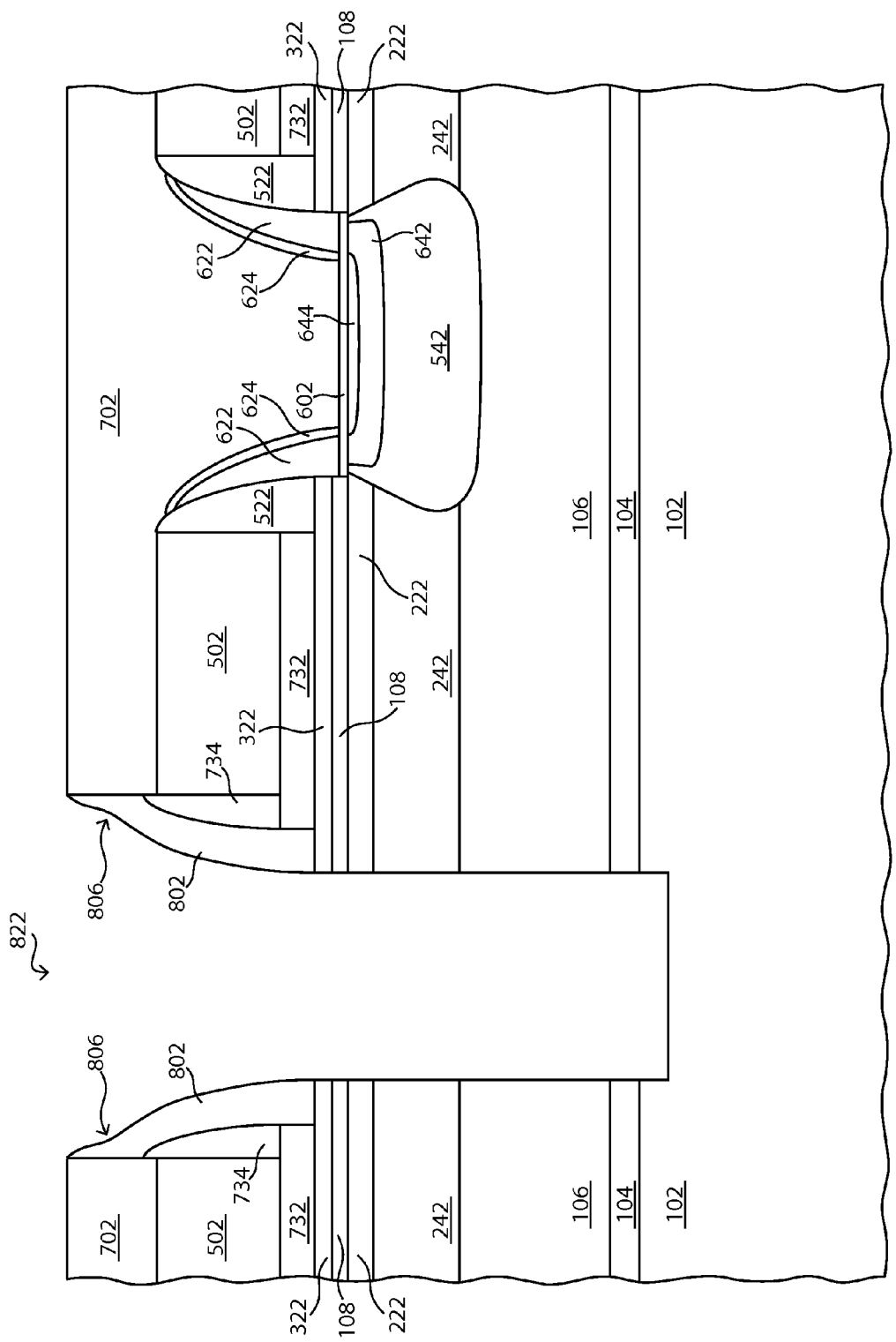
FIGS. 8 and 9 include illustrations of cross-sectional view of the workpiece of FIGS. 6 and 7, respectively, after forming insulating spacers and patterning layers to define trenches extending to the buried conductive region.
Figure 9:
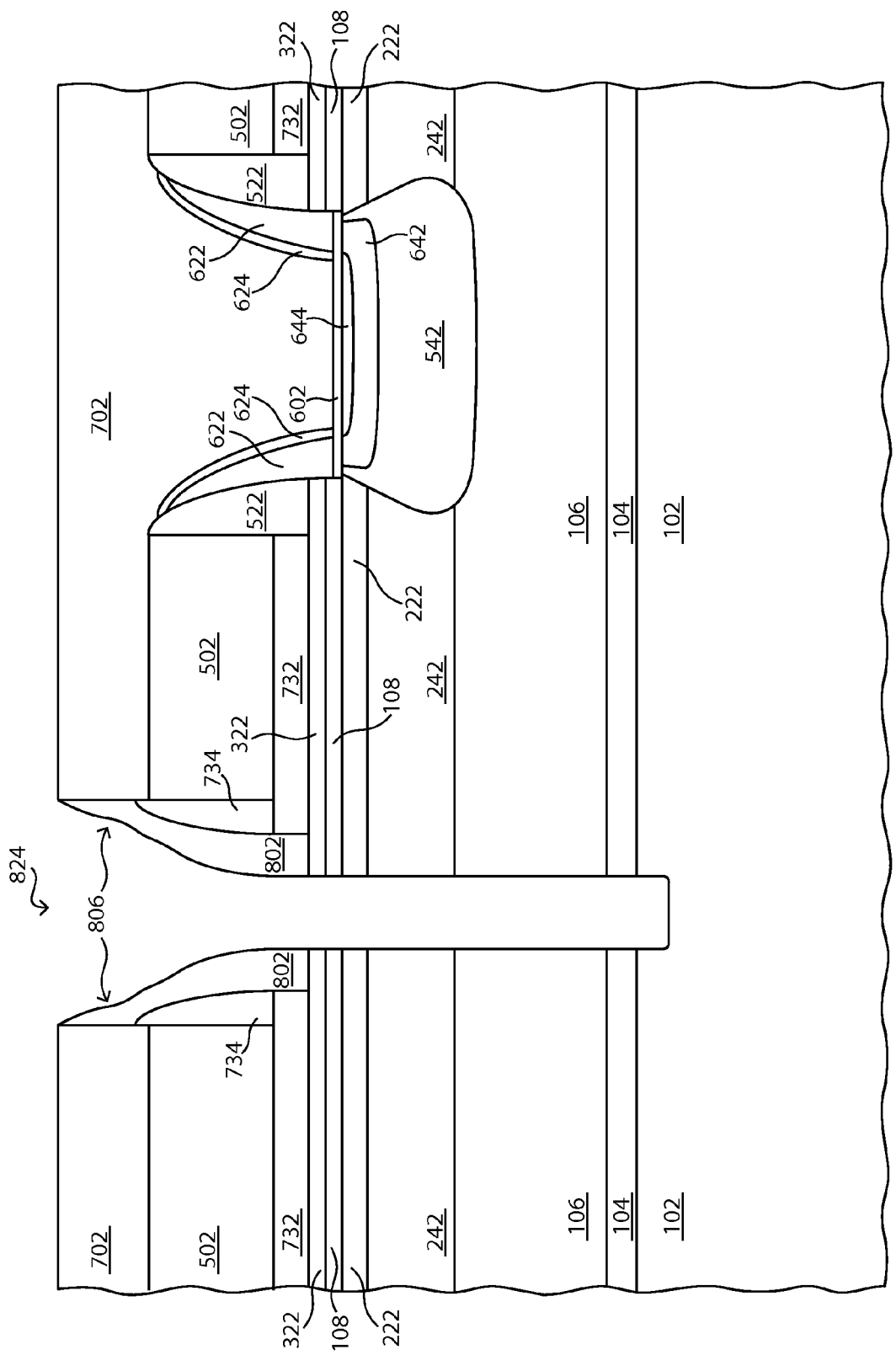

FIGS. 8 and 9 include illustrations of the workpiece after forming insulating spacers 802 and patterning layers to define trenches 822 and 824, of which one of each of the trenches 822 and 824 is illustrated in FIGS. 8 and 9. The insulating spacers 802 can be formed using any of the materials and formation techniques as previously described with respect to the insulating spacers 522. The insulating spacers 802 can be sufficiently wide to allow for a sufficiently high enough breakdown voltage between the conductive electrode members 732 and 734 and subsequently-formed conductive plugs formed within the trenches. In an embodiment, the layer used to form the insulating spacers can be deposited to a thickness, as measured in nm, that is approximately 10 times the breakdown voltage, as measured in V. Thus, for a 20 V breakdown voltage, the layer for the insulating spacers 802 can be deposited to approximately 200 nm. The relationship between the voltage and thickness may be used for guidance and is not intended to be an absolute rule. In another embodiment, the layer can be deposited to a thickness in a range of approximately 110 nm to approximately 400 nm. Part of the exposed ILD layer 702 along its uppermost surface may be etched when forming the insulating spacers 802. The insulating spacers 802 also have inflection points 806. The inflection points 806 may be present due to the conductive electrode members 734 having their uppermost points significantly spaced apart from the upper surface of the ILD layer 702.

Portions of the insulating layer 322, the dielectric layer 108, the horizontally-oriented doped regions 222, the resurf regions 242, the semiconductor layer 106, and the buried insulating layer 104 are patterned to define trenches 822 and 824 that expose portions of the buried conductive region 102. In an embodiment, patterning can be formed using anisotropic etching. Part of the exposed ILD layer 702 along its uppermost surface may be etched when etching the insulating layer 322, the dielectric layer 108, the buried insulating layer 104, or any combination thereof. If needed or desired, etching can be continued to etch a portion of the buried conductive region 102. In an embodiment, the trenches 822 and 824 may extend in a range of approximately 0.2 micron to approximately 2.0 microns into the buried conductive region 102. In another embodiment, the trenches 822 and 824 may be deeper or shallower than described above. In a particular embodiment, the widths of each of the trenches 822 and 824 have been reduced from the widths of the openings 722 and 724 as originally defined due to the conductive electrode members 734 and insulating spacers 802. Thus, the widths of the trenches 822 and 824 at the horizontally-oriented doped regions 222 are approximately the widths of the openings 722 and 724, as formed, minus two times the thicknesses of the layers used to form the conductive electrode members 734 and the insulating spacers 802.

In a further embodiment, the buried insulating layer 104 may not be present. The trenches 822 and 824 may extend completely or only partly to the buried conductive region 102. If the trenches 822 and 824 extend only partly, and not completely, to the buried conductive region 102, bottoms of the trenches 822 and 824 may be doped to ensure portions of the semiconductor layer 106 along the bottoms of the trenches are electrically connected to the buried conductive region 102.

Figure 10:
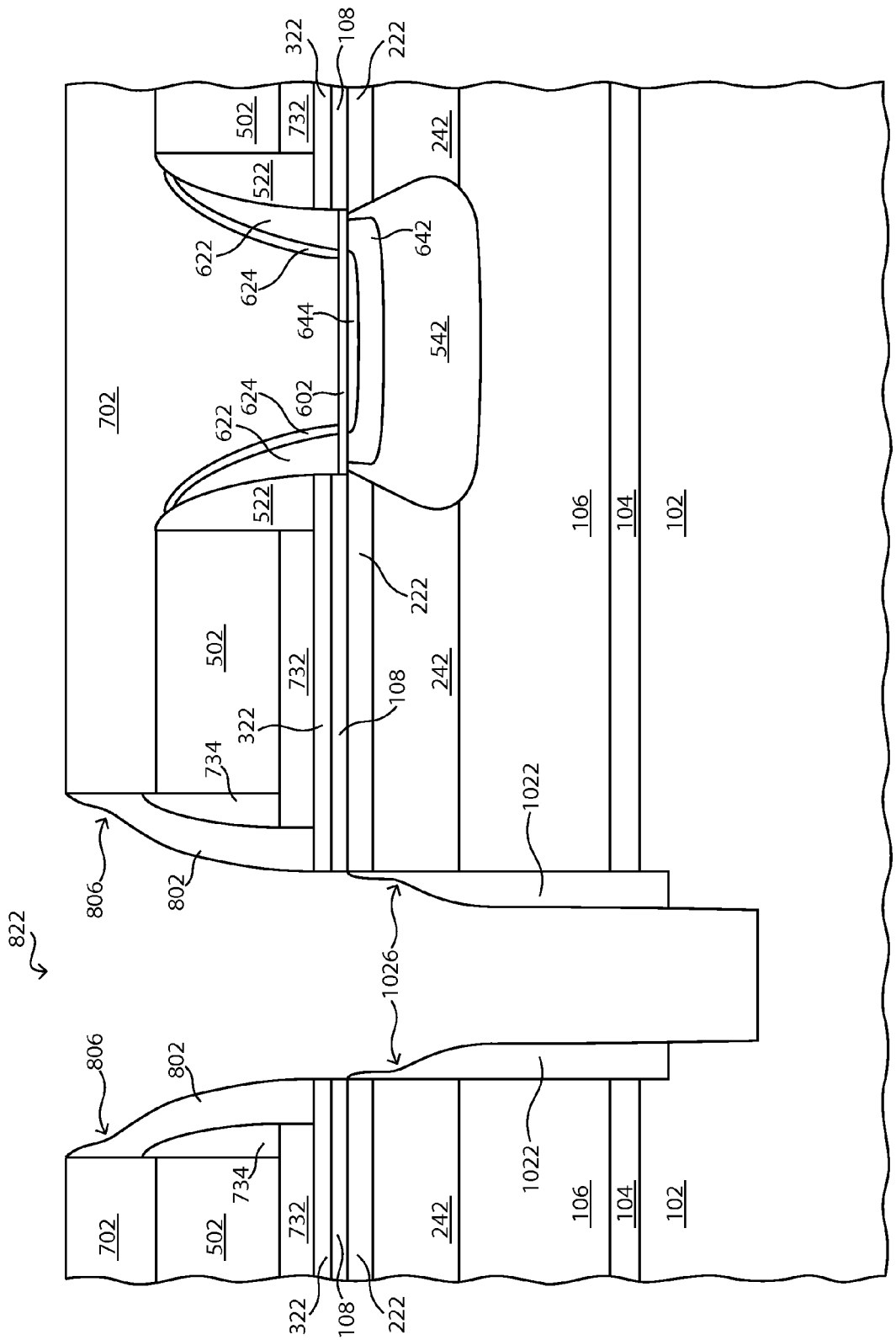
FIGS. 10 and 11 include illustrations of cross-sectional views of the workpiece of FIGS. 8 and 9, respectively, after forming vertical conductive structures within the trenches.
Figure 11:
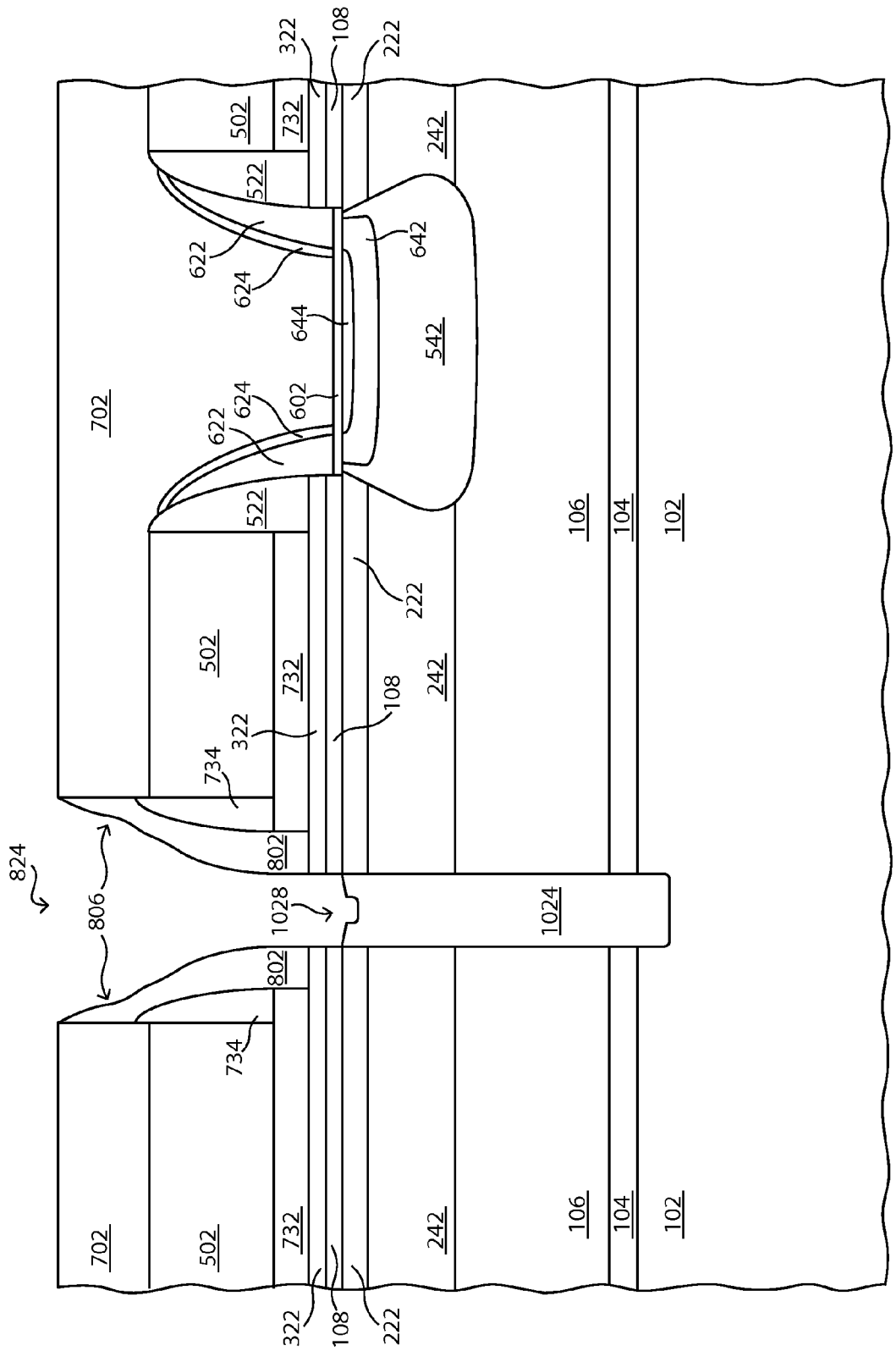

FIGS. 10 and 11 include illustrations after vertical conductive structures 1022 and 1024 that can electrically connect the horizontally-oriented doped regions 222 and the buried conductive region 102 to one another. Although one of each of the conductive structures 1022 and 1024 are illustrated, other conductive structures may be formed elsewhere within the electronic device. In the embodiment as illustrated in FIG. 10, the vertical conductive structures 1022 fill only a part, but not all, of the narrower portion of the trenches 822. The vertical conductive structures 1022 can be part of a capacitor electrode for the capacitor structures being formed within the trenches 822. The vertical conductive structures 1022 have inflection points 1026 that correspond to the inflection points 806. The trenches 822 may be extended further into buried conductive region 102 when the vertical conductive structures 1022 and 1024 are recessed within the trenches 822 and 824. The vertical conductive structure 1024 substantially completely fills the narrower portion of the trench at and below the horizontally-oriented doped regions 222. The top of the vertical conductive region 1024 may have a recession 1028 due to the topography of the exposed surface of the insulating spacers 802.

The vertical conductive structures 1022 and 1024 can be formed from a conductive layer that is formed over the ILD layer 702 and within the trenches 822 and 824. In a particular embodiment, the conductive layer only partly, and not completely, fills the trenches 822, and substantially completely fills the trenches 824. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive fill material can include tungsten or tungsten silicide. In a more particular embodiment, the conductive layer can include Ti/TiN/W. The selection of the number of films and composition(s) of those film(s) depends on electrical performance, the temperature of a subsequent heat cycle, another criterion, or any combination thereof. Refractory metals and refractory metal-containing compounds can withstand high temperatures (e.g., melting points of the refractory metals can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

The portion of the conductive layer that is disposed over the ILD layer 702 is removed. The removal can be performed using a chemical-mechanical polishing or blanket etching technique. An etch or other removal operation is performed to recess the conductive layer further into the trenches 822 and 824 to form vertical conductive structures 1022 and 1024, as illustrated in FIGS. 10 and 11. If the vertical conductive structure 1022 and the buried conductive region 102 include the same material (for example, silicon), a portion of the buried conductive region 102 can be etched as illustrated in FIG. 10.

In another embodiment, the vertical conductive structure 1024 and the buried conductive region 102 include different materials. Thus, the depth of the trenches 822 may not be as deep as illustrated in FIG. 10. In another embodiment, the etch can be extended to further deepen the trenches 822 within the buried conductive region 102 to increase further the capacitance of the capacitor being formed. Thus, the trenches 822 can extend deeper into the buried conductive region 102, as compared to the trenches 824. In an embodiment, the trenches 822 may extend at least approximately 0.2 micron further into the buried conductive region 102, as compared to the trenches 824. In another embodiment, the trenches 822 may extend at least approximately 0.3 micron into the buried conductive region 102 further than the trenches 824. In a further embodiment, the trenches 822 may extend no greater than approximately 2.0 micron further into the buried conductive region 102, as compared to the trenches 824. In another further embodiment, the trenches 822 may extend no greater than approximately 1.1 micron into the buried conductive region 102 further than the trenches 824. After reading this specification, skilled artisans will be able to select materials and determine the depth of the trenches 822 within the buried conductive region 102 for a particular application.

The uppermost elevations of the vertical conductive structures 1022 and 1024 lie at least at the lowest elevations of the horizontally-oriented doped regions 222 immediately adjacent to the trenches 822. As the uppermost elevations of the vertical conductive structures 1022 and 1024 extend to elevations higher than the horizontally-oriented doped regions 222, parasitic capacitive coupling to the conductive electrode members 732 and 734 may become significant. In a particular embodiment, the vertical conductive structures 1022 and 1024 may extend to an elevation no higher than the primary surface 105. None of the vertical conductive structures 1022 and 1024 are covered by the conductive electrode members 732 and 734. From a top view, the vertical conductive structures 1022 and 1024 are between immediately adjacent pairs of conductive electrode members 734 of the conductive electrodes. In a finished electronic device, the buried conductive region 102 can provide an electrical connection to the drain of the transistor.

The vertical conductive structures 1022 and 1024 are examples of vertical conductive regions. In another embodiment, a different type of vertical conductive region may be used. For example, in an embodiment in which the buried insulating layer 104 is not present, the vertical conductive regions may be the vertical conductive structures 1022 and 1024 or may be formed by doping portions of the horizontally-oriented doped regions 222, resurf regions 242 and semiconductor layer 106 to form heavily doped regions extending from the horizontally-oriented doped regions 222 to the buried conductive region 102. The heavily doped regions have the same conductivity type as the horizontally-oriented doped regions 222 and can have a shape similar to the vertical conductive structures 1022 and 1024. The heavily doped regions may be formed using different implants at different energies, so that a relatively low resistance connection is made between the horizontally-oriented doped regions 222 and the buried conductive region 102. When the vertical conductive structures are replaced by the heavily doped regions, the heavily doped regions may be formed earlier in the process flow.

Figure 12:
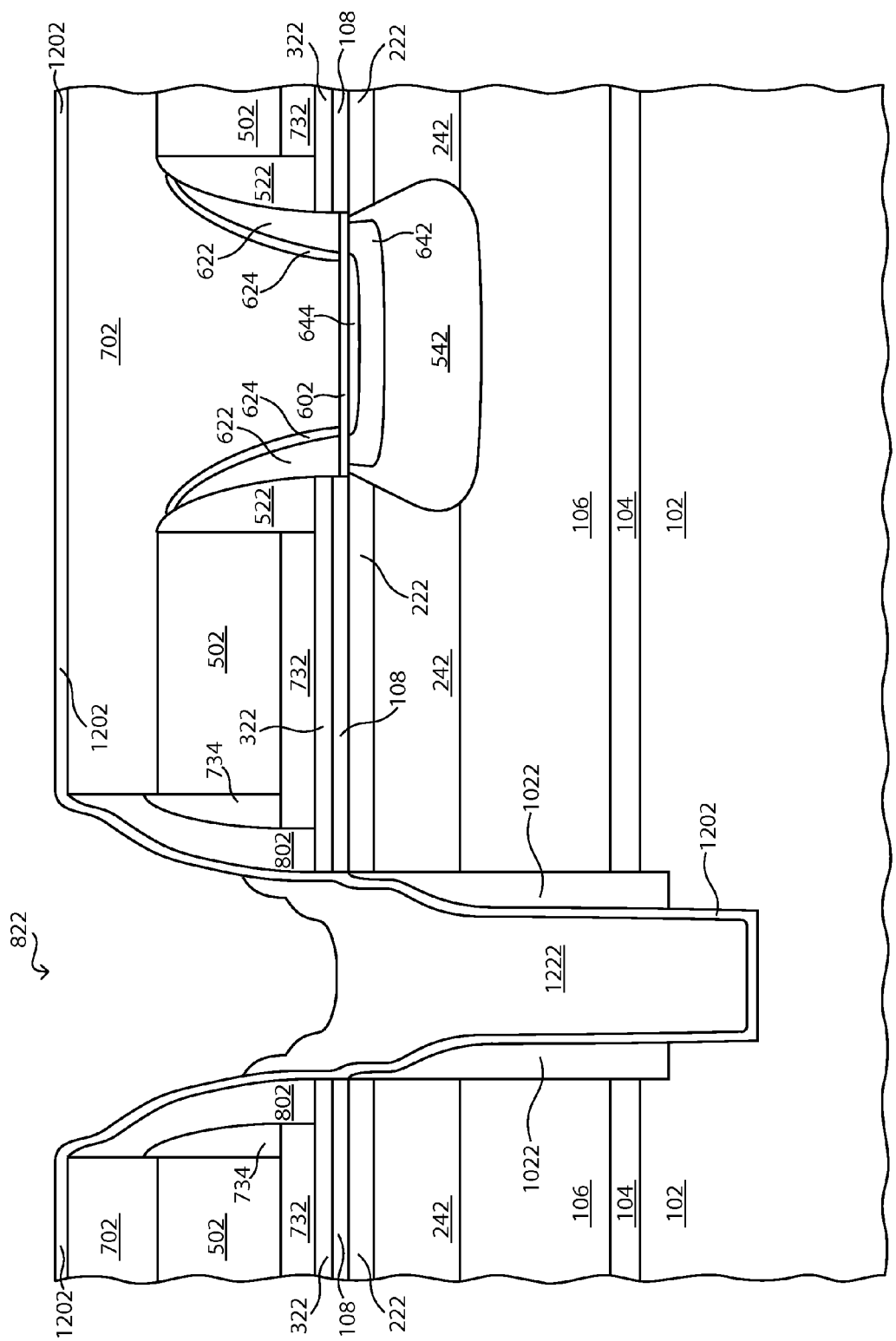
FIGS. 12 and 13 include illustrations of cross-sectional views of the workpiece of FIGS. 10 and 11, respectively, after forming a capacitor dielectric layer and a capacitor electrode.
Figure 13:
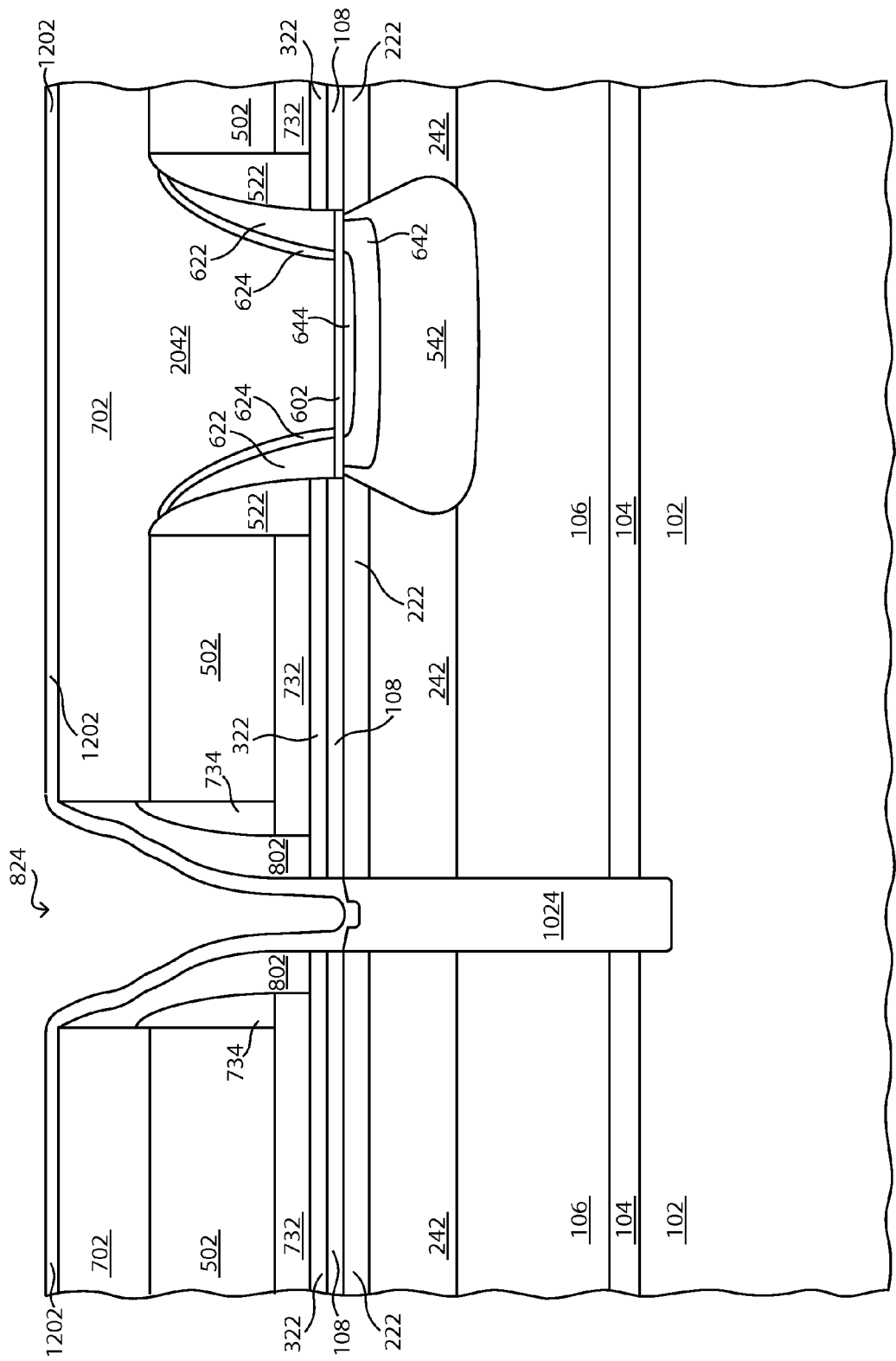

FIGS. 12 and 13 include illustrations after forming a capacitor dielectric layer 1202 and a capacitor electrode 1222. The capacitor dielectric layer 1202 can include an oxide, a nitride, an oxynitride, or any combination thereof and can be thermally grown, deposited, or a combination thereof. The capacitor dielectric layer 1202 can include a single film or a plurality of films. In a particular embodiment, the capacitor dielectric layer 1202 can include an oxide film and a nitride film, and in another embodiment, the capacitor dielectric layer 1202 can include an oxide film, a nitride film, and another oxide film (ONO). The capacitor dielectric layer 1202 only partly, and does not completely, fill the remaining portion of the narrower part of the trenches 822. In the embodiment as illustrated, a portion of the capacitor dielectric layer 1202 extends into the buried conductive region 102 and can abut the buried conductive region 102.

The capacitor electrode 1222 can be formed from a conductive layer that can include any of the materials or be formed using any of the techniques as described with respect to the conductive layer used to form the conductive layer for the vertical conductive structures 1022 and 1024. In an embodiment, the conductive layer formed over the ILD layer 702 and within the trenches 822 and 824 has the same composition and is formed using the same technique as the conductive layer used to form the vertical conductive structures 1022 and 1024. In another embodiment, the conductive layer formed over the ILD layer 702 and within the openings 722 and 724 has a different composition or is formed using a different technique as compared to the conductive layer for the vertical conductive structures 1022 and 1024. The conductive layer for the capacitor electrode 1222 substantially completely fills the narrow portion of the trenches 822 and may or may not completely fill the wider portion of the trenches 822.

The portion of the conductive layer that is disposed over the ILD layer 702 is removed. The removal can be performed using a chemical-mechanical polishing or blanket etching technique. If needed or desired, an etch or other removal operation is performed to recess the conductive layer further into the trenches 822 to form capacitor electrode 1222, as illustrated in FIG. 12, and to remove any remaining portion of the conductive layer overlying the capacitor dielectric layer 1202 within the trenches 824. The workpiece at the location corresponding to FIG. 13 does not include any portion of the conductive layer that was used to form the capacitor electrode 1222. At this point in the process, a trench capacitor structure has been formed. In the embodiment as illustrated in FIG. 12, the trench capacitor structure within the trenches 822 includes a capacitor electrode, including the vertical conductive structures 1022 and buried conductive region 102; the capacitor dielectric layer 1202; and the capacitor electrode 1222. Referring to FIG. 13, the trenches 824 do not include a capacitor structure having a capacitor dielectric layer.

Figure 14:
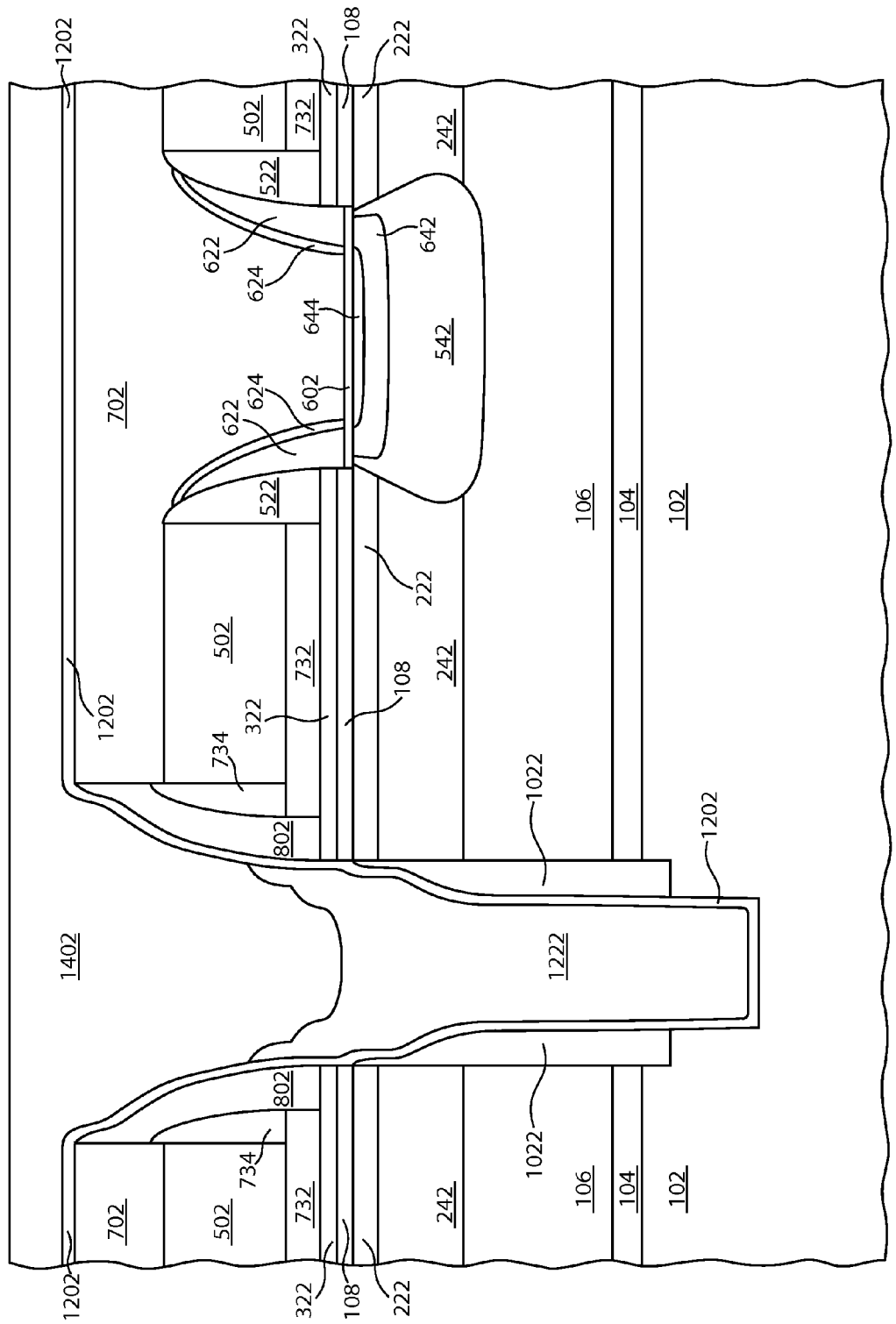
FIGS. 14 and 15 include illustrations of cross-sectional views of the workpiece of FIGS. 12 and 13, respectively, after forming another ILD layer.
Figure 15:
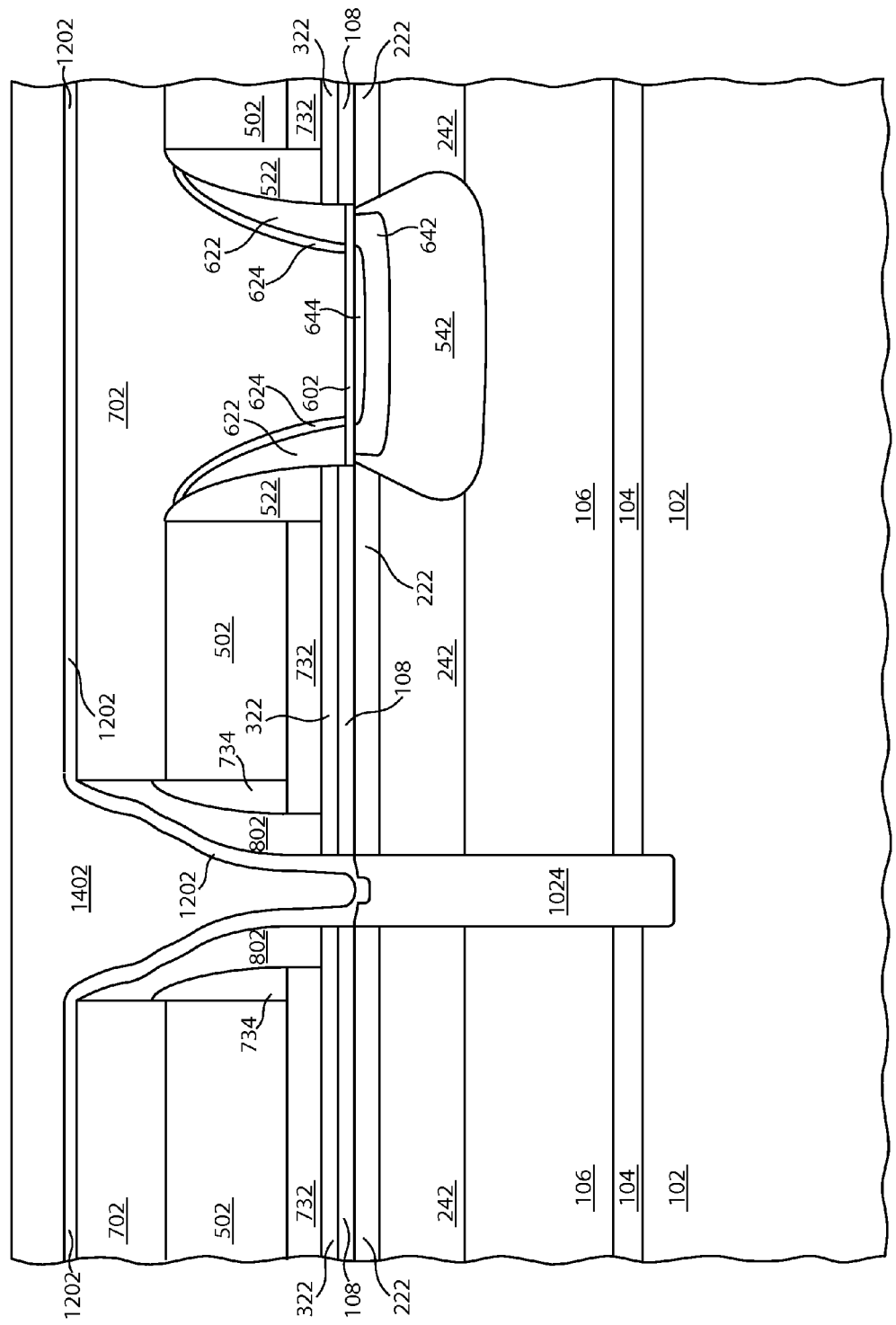

FIGS. 14 and 15 include illustrations of the workpiece after forming an ILD layer 1402. The ILD layer 1402 is formed over the capacitor dielectric layer 1202 and substantially completely fills remaining portions of the trenches 822 and 824 (labeled in FIGS. 12 and 13). The ILD layer 1402 can include any of the materials, films, and thicknesses as previously described with respect to the ILD layer 702. The ILD layer 1402 can have the same or different materials, films, and thicknesses as compared to the ILD layer 702. The ILD layer 1402 can be planarized. In the embodiment as illustrated in FIGS. 14 and 15, a portion of the ILD layer 1402 overlies the ILD layer 702. In another embodiment (not illustrated), substantially all of the ILD layer 1402 overlying the ILD layer 702 may be removed.

Figure 16:
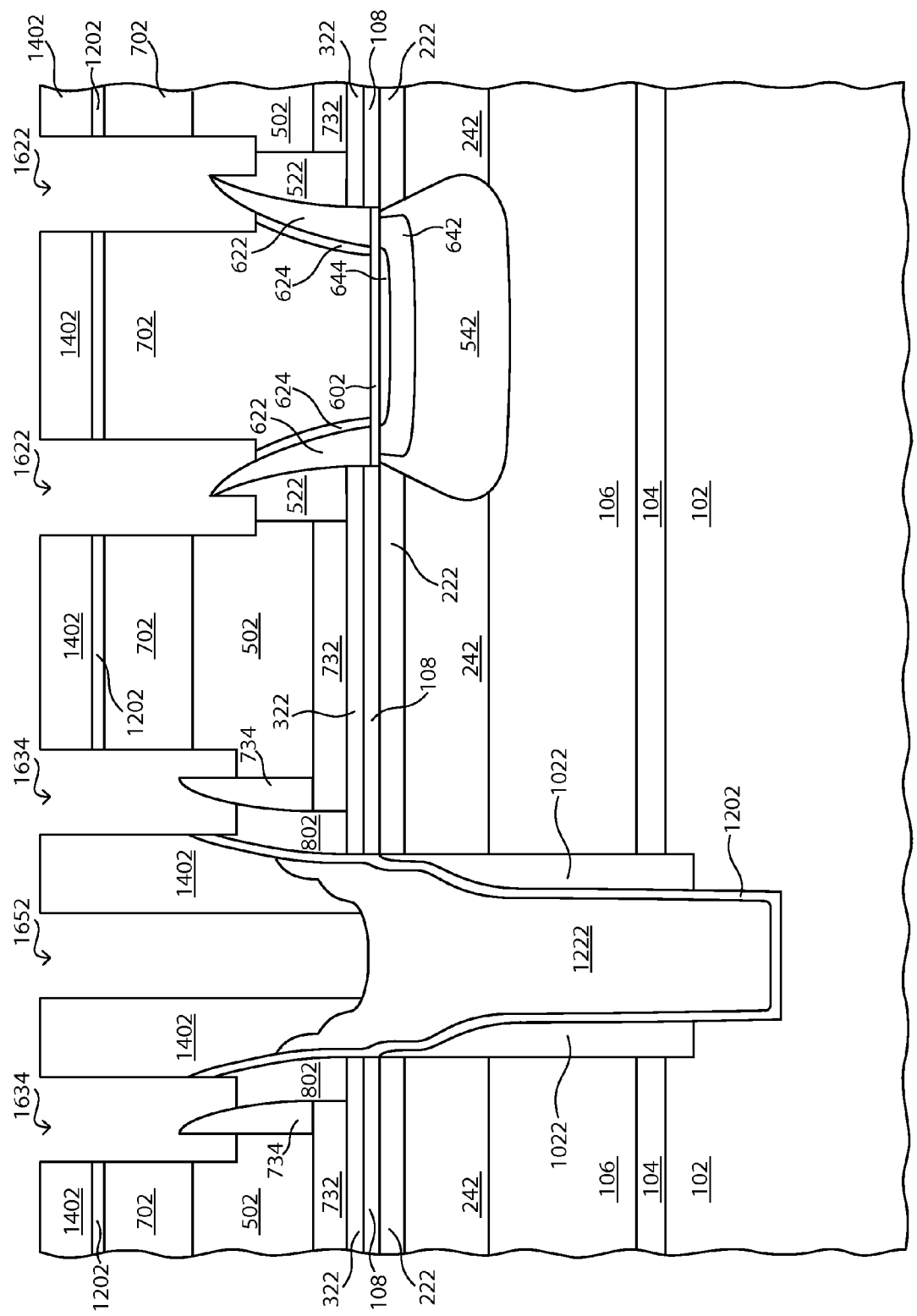
FIGS. 16 and 17 include illustrations of cross-sectional views of the workpiece of FIGS. 14 and 15, respectively, after patterning layers to define contact openings over the gate electrodes, conductive electrode members, and a capacitor electrode.
Figure 17:
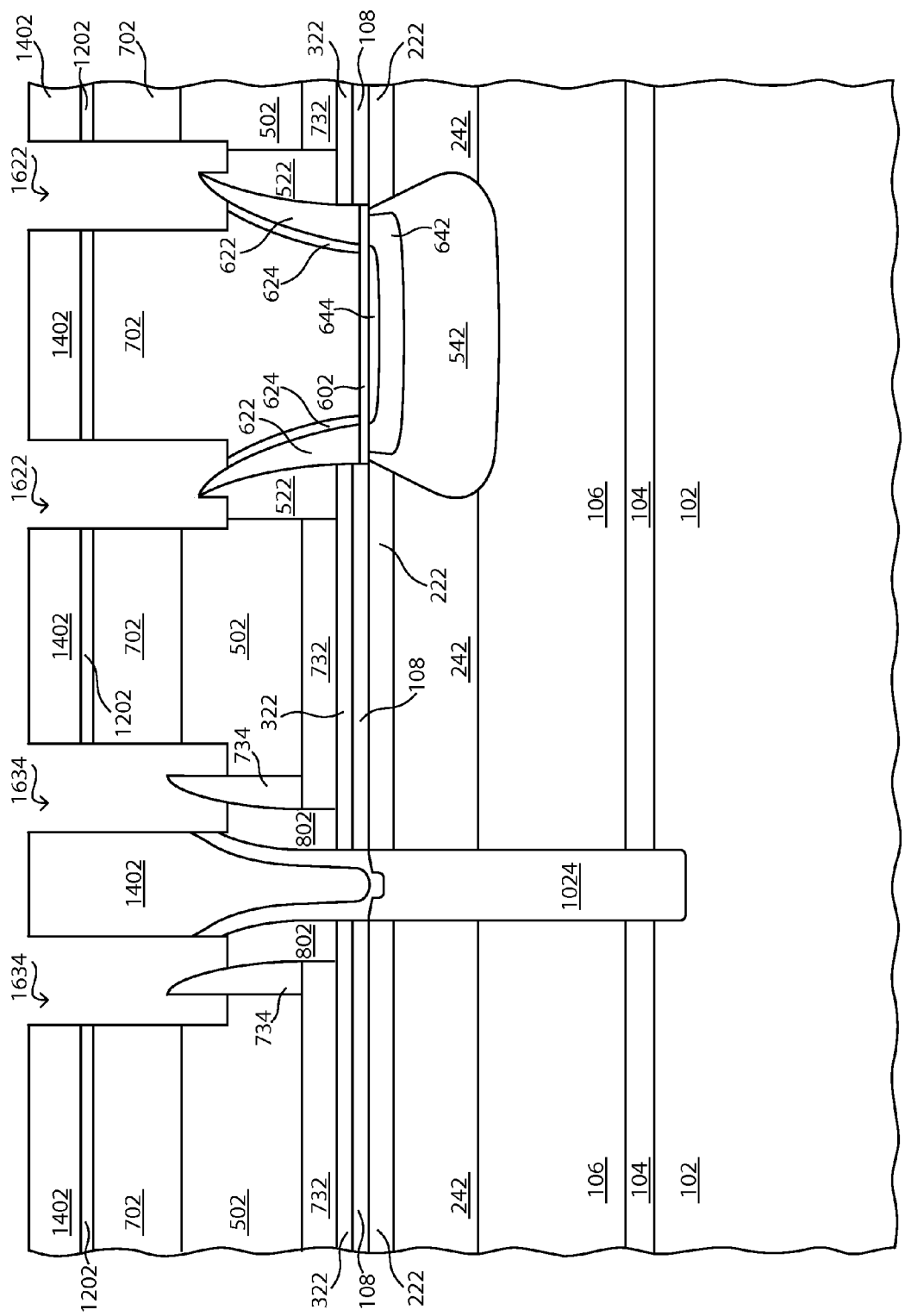

A patterned masking layer (not illustrated) is formed over the workpiece and defines openings under which conductive plugs will be subsequently formed. In the embodiment as illustrated in FIGS. 16 and 17, the ILD layer 1402, the capacitor dielectric layer 1202, the ILD layer 702, and the insulating layer 502 are patterned to define contact openings including openings 1622 to the gate electrodes 622, openings 1634 to the conductive electrode members 734, and an opening 1652 to the capacitor electrode 1222. Although not illustrated in FIGS. 16 and 17, other contact openings to other gate electrodes 622, conductive electrode members 734, and capacitor electrodes 1222 at other locations may also be defined.

Figure 18:
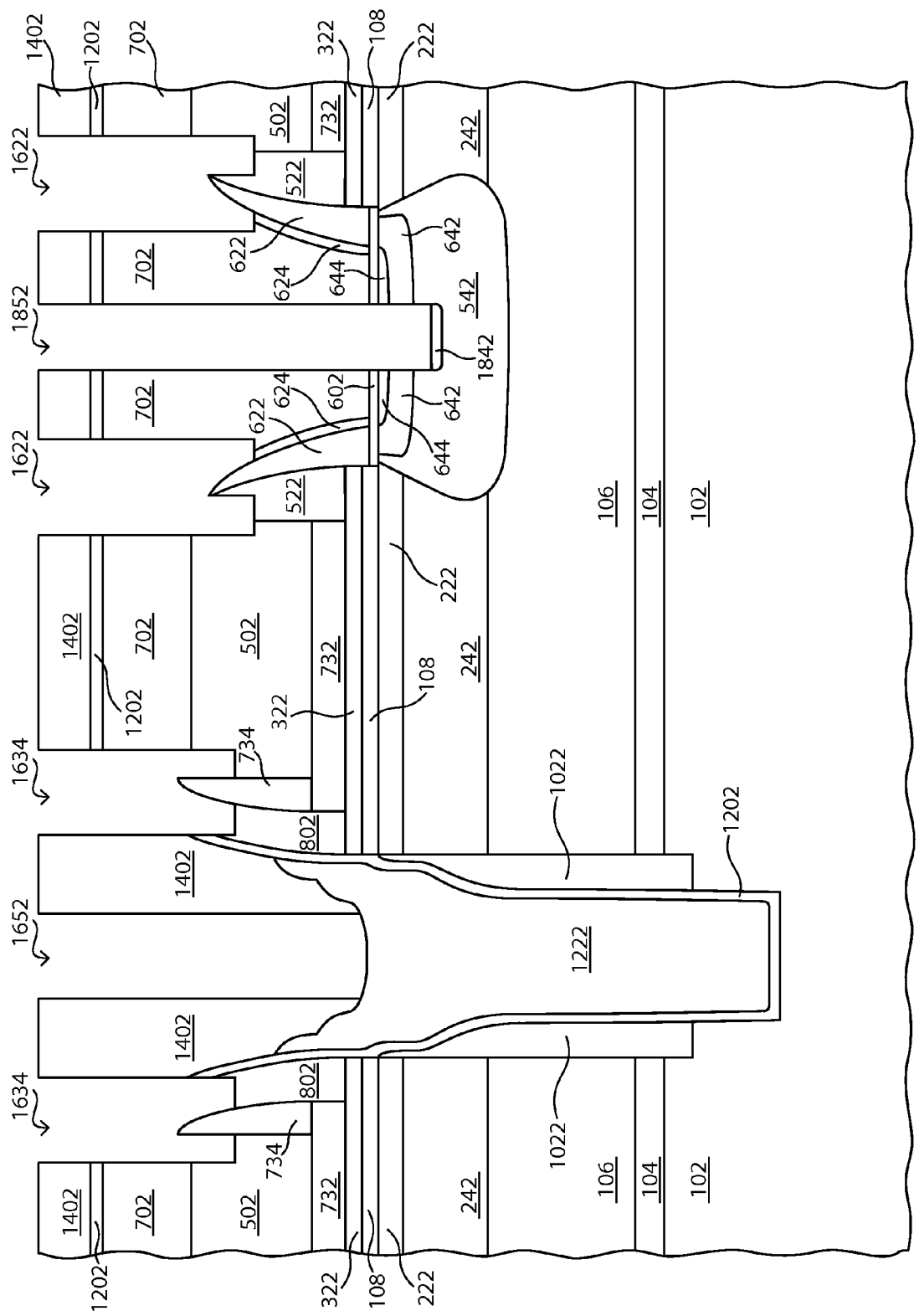
FIGS. 18 and 19 include illustrations of cross-sectional views of the workpiece of FIGS. 16 and 17, respectively, after patterning layers to define openings to the body regions and forming heavily doped regions along bottoms of the openings to the body regions.
Figure 19:
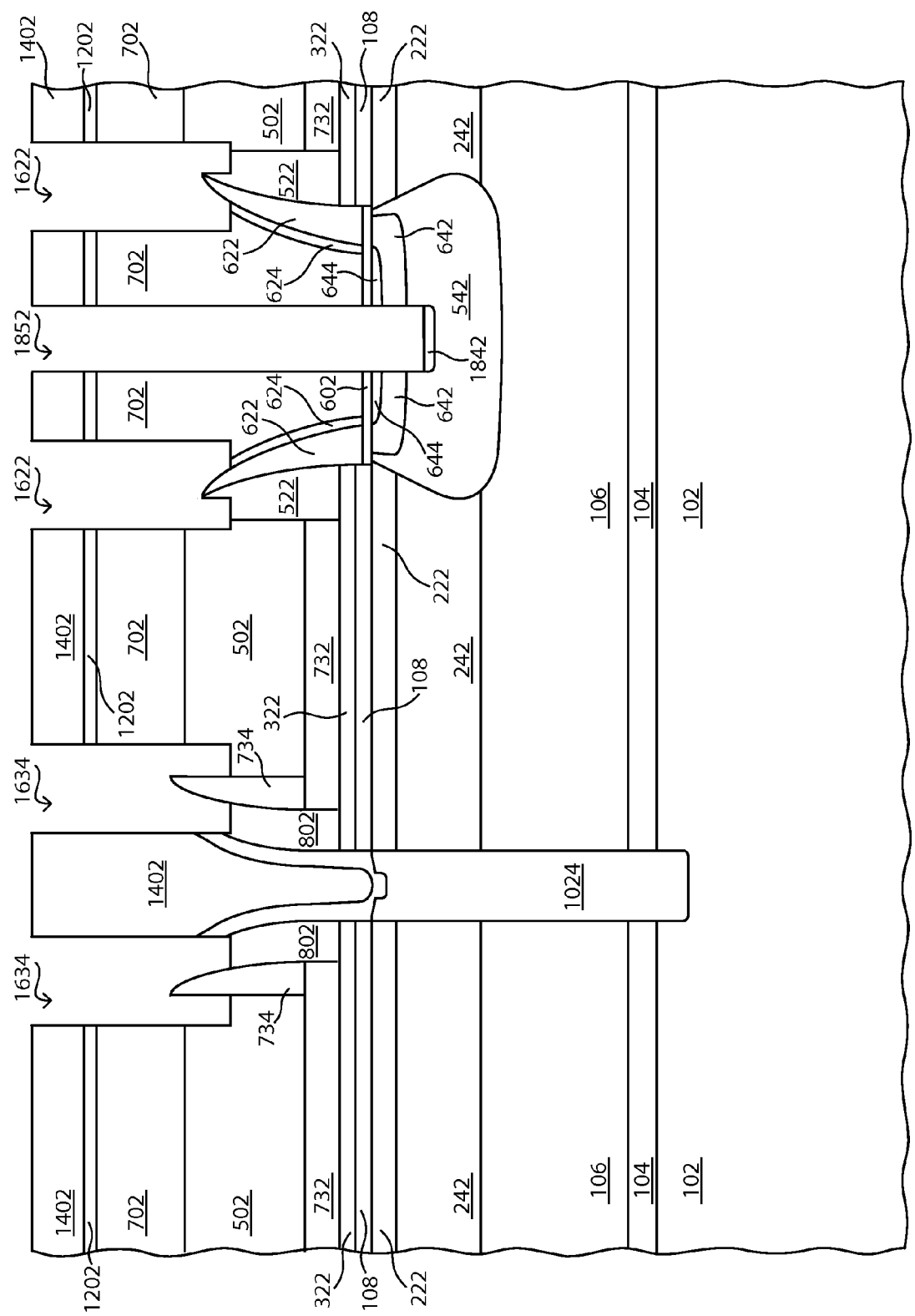

FIGS. 18 and 19 include illustrations of the workpiece after patterning layers to define openings 1852, and doped regions 1842. The openings 1852 allow for source/body contacts to be made. The ILD layers 1402 and 702, the capacitor dielectric layer 1202, and the gate dielectric layer 602 can be patterned to define the openings 1852. The openings 1852 extend through the source regions 644 to the body regions 642. In another embodiment, the openings 1852 may extend through the body regions 642 to the deep body doped regions 542. The bottoms of the openings 1852 can be doped to form heavily doped regions 1842, which allow ohmic contacts to be formed to the body regions 642. The heavily doped regions 1842 have the same conductivity type as body regions 642 and a dopant concentration of at least $1 \times 10^{19}$ atoms/cm$^3$.

In an embodiment, after forming the openings 1852, a sacrificial layer (not illustrated) may be formed along exposed portions of source regions 644 to reduce the likelihood of counterdoping of such regions. If needed or desired, the sacrificial layer may be anisotropically etched along the bottom of the openings 1852. The heavily doped regions 1842 may be formed by ion implantation or another suitable doping technique. The workpiece may be annealed to activate the dopants introduced into the workpiece during the contact opening process sequence. After doping and anneal, the sacrificial layer is removed to expose portions of the source regions 644.

Figure 20:
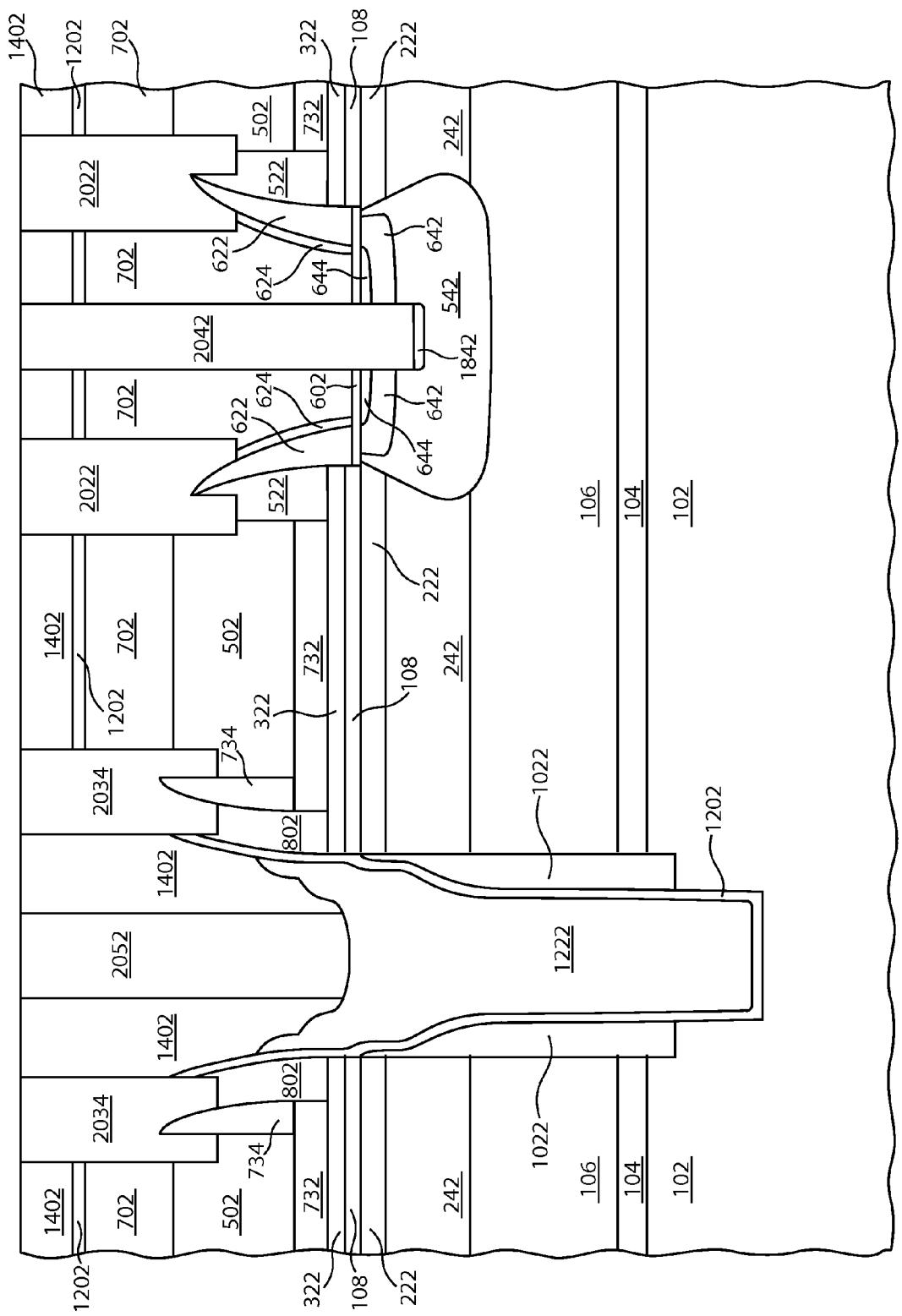
FIGS. 20 and 21 include illustrations of cross-sectional views of the workpiece of FIGS. 18 and 19, respectively, after forming conductive plugs.
Figure 21:
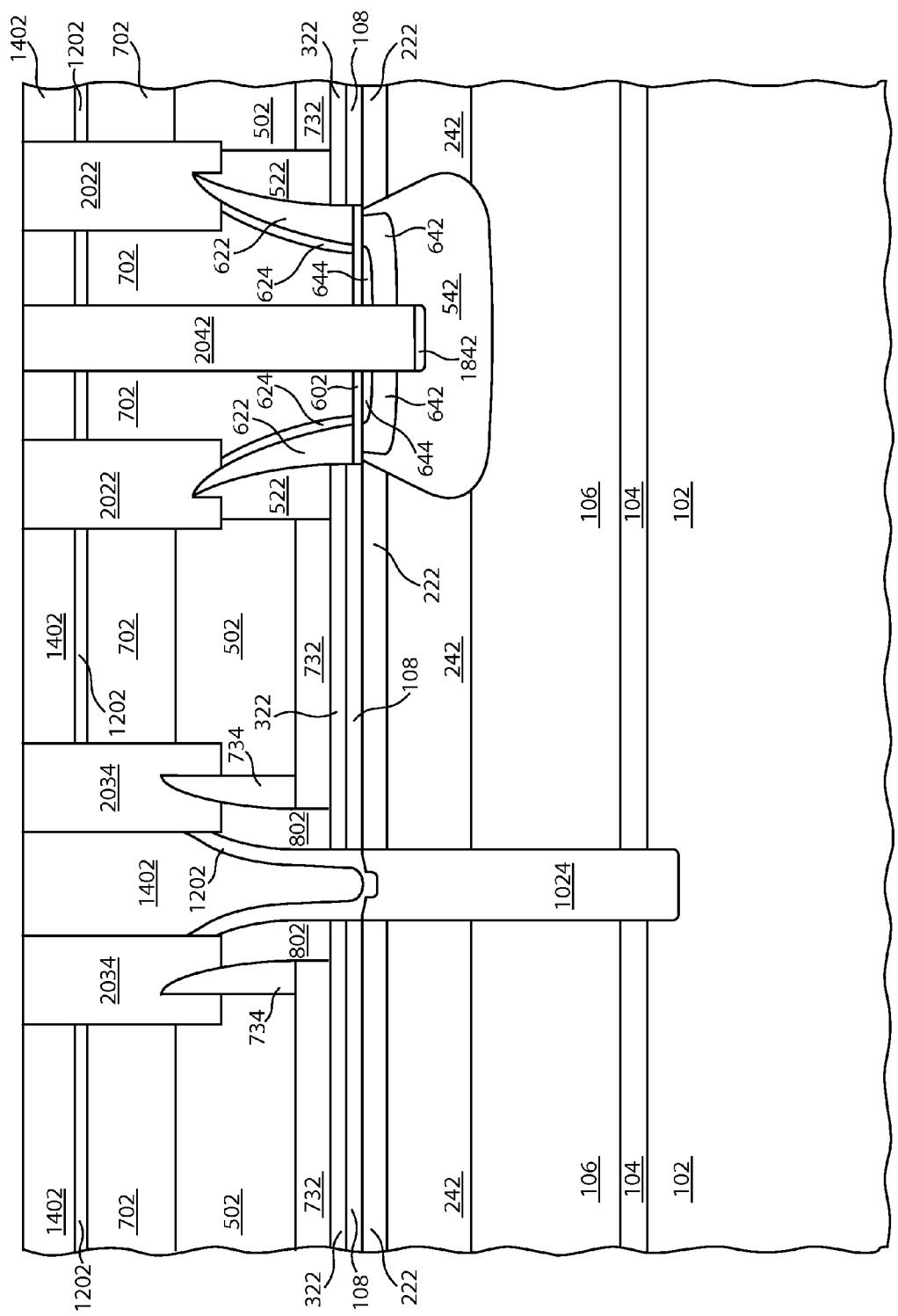

FIGS. 20 and 21 include illustrations after forming conductive plugs 2022, 2034, 2042, and 2052. The conductive plugs 2022 are electrically connected to the gate electrodes 622 of the transistor structures, the conductive plugs 2034 are electrically connected to the conductive electrode members 734, the conductive plugs 2042 are electrically connected to the source regions 644 and the bodies of the transistor structures, and the conductive plug 2052 is electrically connected to the capacitor electrode 1222. In an embodiment, none of the conductive plugs within the ILD layer 1402 is electrically connected to the horizontally-oriented doped regions 222 or the vertical conductive structures 1024. Drains for the transistor structures include portions of the horizontally-oriented doped regions 222 and are electrically connected to the buried conductive region 102 via the vertical conductive structures 1022 and 1024.

In an embodiment, the conductive plugs 2022, 2034, 2042, and 2052 can be formed using a plurality of films. In an embodiment, a layer including a refractory metal, such as Ti, Ta, W, Co, Pt, or the like, can be deposited over the workpiece and within the openings 1622, 1634, 1652, and 1852. If needed or desired, a layer including a metal nitride layer can be deposited over the layer including the refractory metal. The workpiece can be annealed so that portions of the layer including the refractory metal are selectively reacted with exposed silicon, such as substantially monocrystalline or polycrystalline silicon, to form a metal silicide. Thus, portions of the gate electrodes 622, conductive electrode members 734, source regions 644, body regions 642, and heavily doped regions 1842 can react with the metal within the layer that includes the refractory metal to form a metal silicide. If the capacitor electrode 1222 includes silicon, the refractory metal may also react with a portion of the capacitor electrode 1222. Portions of the layer that include the refractory metal that contact an insulating layer do not react. A metal nitride layer may be formed to further fill a part, but not the remainder of the openings. The metal nitride layer and can act as a barrier layer. A layer of a conductive material fills the remainder of the contact openings 1622, 1634, 1652, and 1852. Portions of the layer including the refractory metal, the metal nitride layer and the conductive material that overlies the ILD layer 1402 are removed to form the conductive plugs 2022, 2034, 2042, and 2052.

Figure 22:
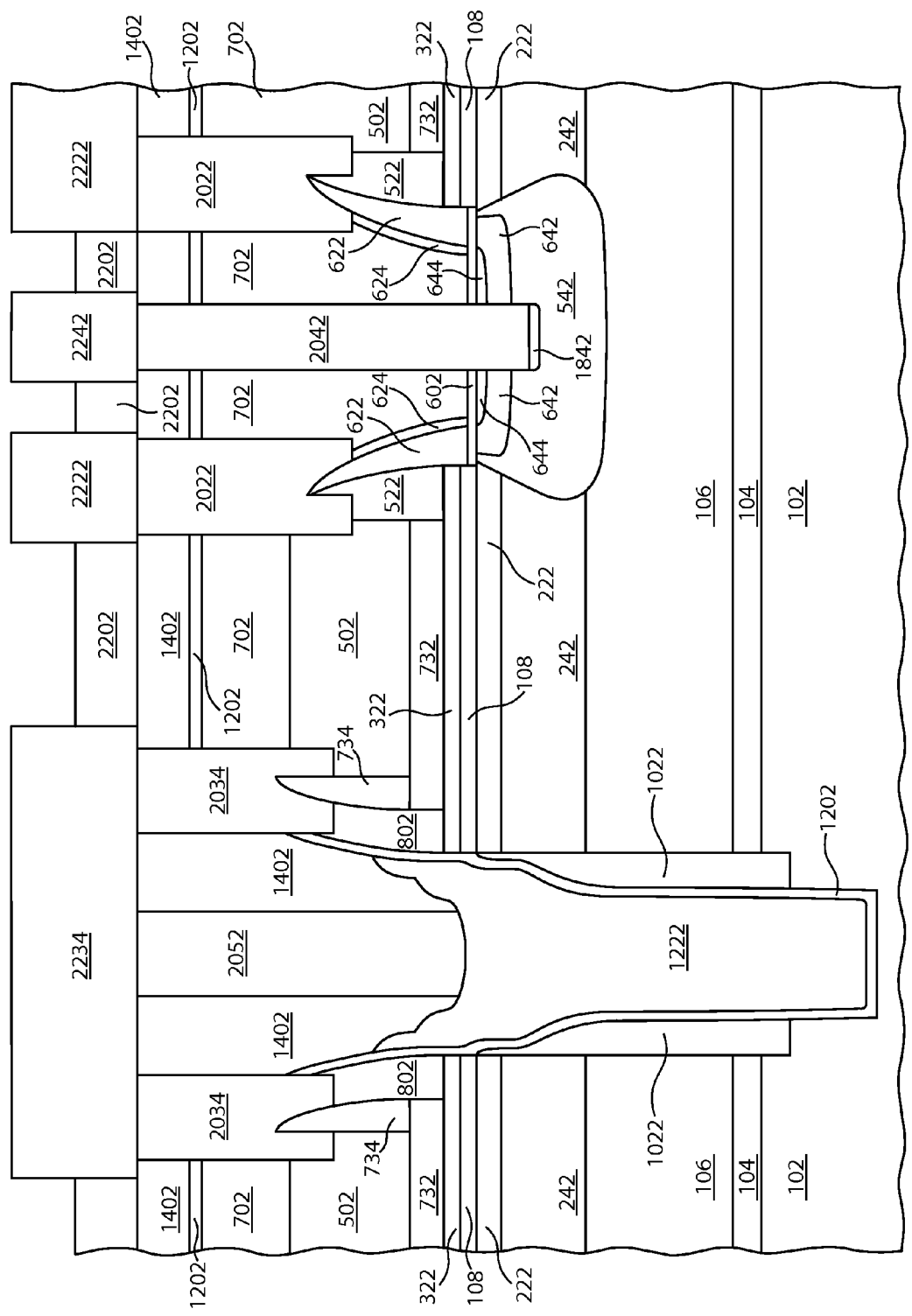
FIGS. 22 and 23 include illustrations of cross-sectional views of the workpiece of FIGS. 20 and 21, respectively, after forming a first level of interconnects for the transistor and capacitor structures.
Figure 23:
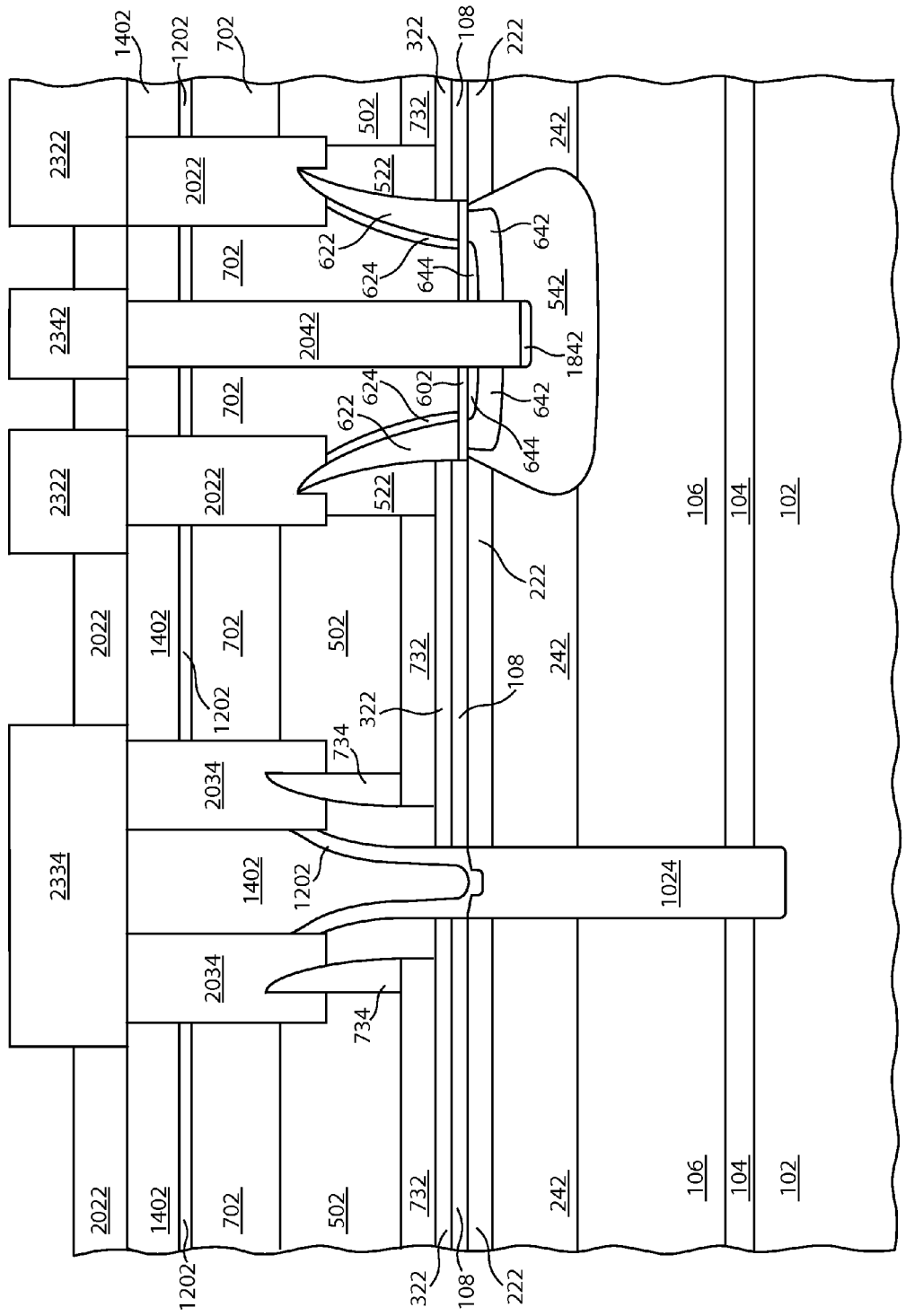

FIGS. 22 and 23 include illustrations of the workpiece after a first level of interconnects is formed. The ILD layer 2202 can include any of the compositions as previously described with respect to the ILD layer 702. The ILD layer 2202 can have substantially the same composition or a different composition as compared to the ILD layer 702. The ILD layer 2202 is patterned to define contact openings.

Interconnects 2222, 2234, 2242, 2322, 2334, and 2342 are formed that extend at least partly within the openings within the ILD layer 2202. The interconnects 2222 and 2322 are electrically connected to the conductive plugs 2022 and the gate electrodes 622. The interconnects 2222 may be parts of the same interconnect or may be different interconnects that are electrically connected at a different level of interconnects. The interconnects 2322 may be parts of the same interconnect or may be different interconnects that are electrically connected at a different level of interconnects. The interconnects 2222 may not be electrically connected to the interconnects 2322, so that the transistor structure in FIG. 22 may be controlled independently of the transistor structure in FIG. 23. The interconnects 2234 and 2334 are electrically connected to the conductive plugs 2034 and the conductive electrode members 734. The interconnects 2242 and 2342 are electrically connected to the conductive plugs 2042, source regions 644, and body regions 642. The interconnects 2234 and 2242 may be electrically connected to each other, and the interconnect 2334 and 2342 may be connected to each other. Depending on the design of the electronic device, the interconnects 2234, 2242, 2334, and 2342 may or may not be electrically connected to one another. In a particular embodiment, the interconnects 2234, 2242, 2334, and 2342 are electrically connected to one another and to a power supply terminal, such as $V_s$.

Although not illustrated, additional or fewer layers or features may be used as needed or desired to form the electronic device. Field isolation regions are not illustrated but may be used to help electrically isolate portions of the power transistor. In another embodiment, more insulating and interconnect levels may be used. A passivation layer can be formed over the workpiece or within the interconnect levels. After reading this specification, skilled artisans will be able to determine layers and features for their particular application.

The electronic device can include many other transistor and capacitor structures that are substantially identical to the transistor and capacitor structures as illustrated in FIGS. 22 and 23. For example, the transistor structures in FIG. 23 can be connected in parallel with each other to form the transistor. Such a configuration can give a sufficient effective channel width of the electronic device that can support the relatively high current flow that is used during normal operation of the electronic device. The capacitor structures can be integrated into the process flow and occupy a relatively small amount of area.

In still another embodiment, one or more bipolar transistors may be used instead of the field-effect transistors. In this embodiment, current carrying electrodes can include emitter regions and collector regions instead of the source regions and drain regions, and control electrodes can include base regions instead of gate electrodes. If a buried collector is used, the buried collector can be patterned to allow a properly isolated connection to be made to the buried conductive region 102.

Figure 24:
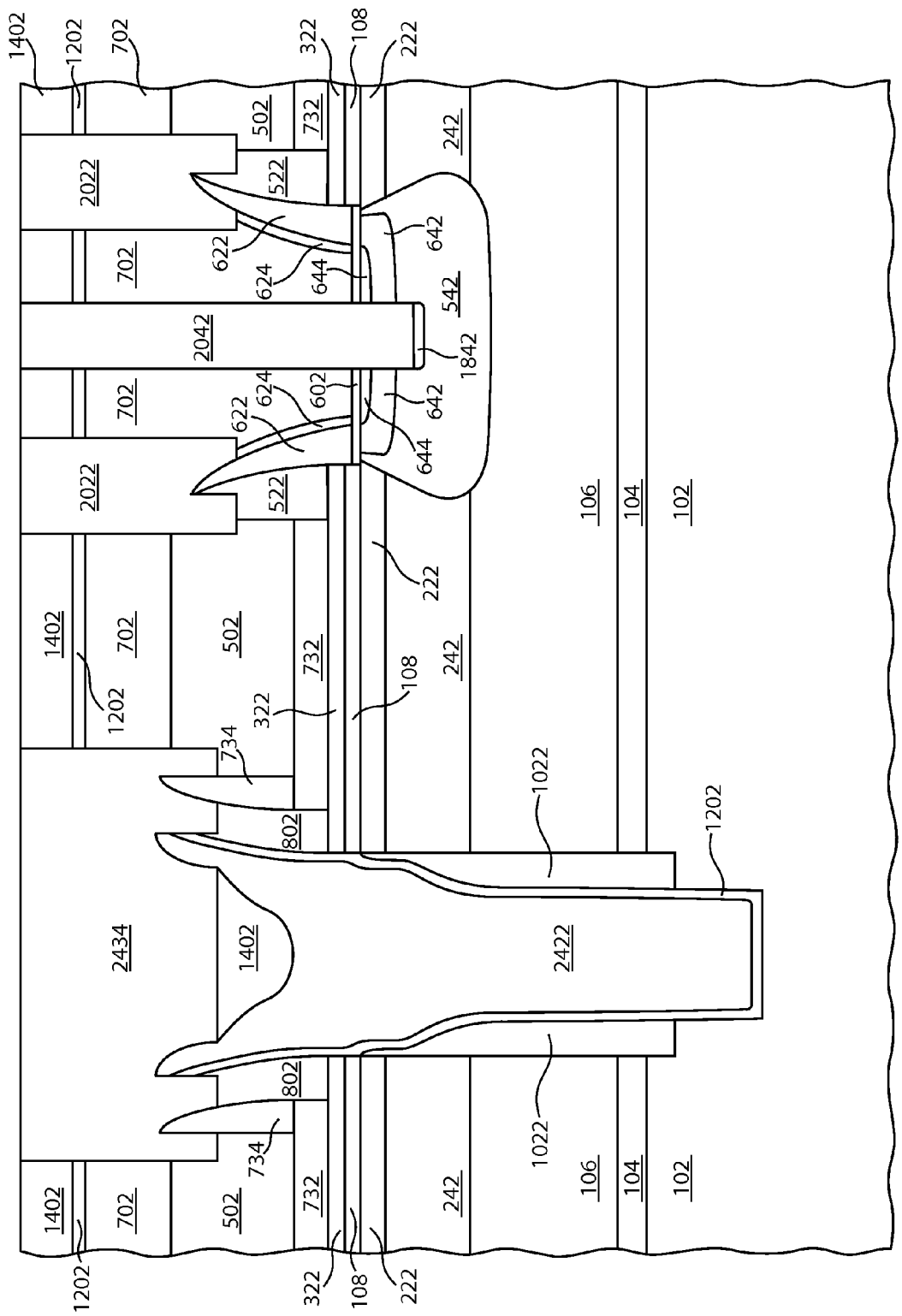
FIG. 24 includes an illustration of a cross-sectional view of a portion of a workpiece in accordance with an alternative embodiment in which a single conductive plug electrically connects conductive electrode members and a capacitor electrode to one another.

FIG. 24 includes an illustration of another embodiment in which a conductive plug 2434 can electrically connect the conductive electrode members 734 to a capacitor electrode 2422 of a capacitor structure. The processing as previously described can be modified so that the uppermost portions of capacitor electrode 2422 lies at a higher elevation as compared to the capacitor electrode 1222 as illustrated in FIG. 12. The contact openings 1634 and 1652 and conductive plugs 2034 and 2052 are replaced by a single contact opening and a single conductive plug 2434 that electrically connects the conductive electrode members 734 to the capacitor electrode 2422.

The embodiments as described can allow for a relatively high capacitance capacitor to be formed without occupying a large area of the workpiece. The capacitor structure can be useful for achieving a high output capacitance for a circuit, such as a power switching circuit within a high-frequency voltage regulator.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. An electronic device can include a buried conductive region a semiconductor layer having a primary surface and an opposing surface, wherein the buried conductive region is disposed closer to the opposing surface than to the primary surface, and the semiconductor layer defines a trench having a sidewall and being adjacent to the primary surface and extending toward the buried conductive region. The electronic device can further include a horizontally-oriented doped region adjacent to the primary surface, a first insulating layer overlying the horizontally-oriented doped region, a conductive electrode overlying the first insulating layer, a capacitor structure. The capacitor structure can include a first capacitor electrode, a capacitor dielectric layer, and a second capacitor electrode within the trench. The first capacitor electrode can include a vertical conductive region adjacent to the sidewall of the trench and extending toward the buried conductive region, wherein the vertical conductive region is electrically connected to the horizontally-oriented doped region and the buried conductive region. The capacitor structure can be spaced apart from and does not underlie the conductive electrode.

Item 2. The electronic device of Item 1, wherein the first capacitor electrode is disposed between the capacitor dielectric layer and the sidewall of the trench.

Item 3. The electronic device of Item 1, wherein the first capacitor dielectric layer abuts the sidewall of the trench.

Item 4. The electronic device of Item 1, wherein the horizontally-oriented doped region is at least part of a drain region or a collector of a transistor structure.

Item 5. The electronic device of Item 4, further including a gate electrode or a base region of the transistor structure, and a source region or an emitter of the transistor structure, wherein the conductive electrode is electrically connected to the source or emitter region.

Item 6. The electronic device of Item 1, wherein the capacitor dielectric layer includes a nitride film.

Item 7. The electronic device of Item 6, wherein the capacitor dielectric layer further includes an oxide film.

Item 8. The electronic device of Item 7, wherein the oxide film is disposed between the first capacitor electrode and the nitride film.

Item 9. The electronic device of Item 1, wherein the conductive electrode has a first portion that lies substantially along a first plane and a second portion having a height that is substantially perpendicular to the first plane, and the second capacitor electrode has an uppermost location at an elevation higher than a highest elevation of the first portion of the conductive electrode.

Item 10. The electronic device of Item 9, wherein a same conductive plug abuts the second capacitor electrode and the second portion of the conductive electrode.

Item 11. An electronic device can include a buried conductive region and a semiconductor layer having a primary surface and an opposing surface, wherein the buried conductive region is disposed closer to the opposing surface than to the primary surface, the semiconductor layer defines a first trench having a sidewall, and the first trench is adjacent to the primary surface and extends toward the buried conductive region. The electronic device can further include a first transistor structure including a first horizontally-oriented doped region adjacent to the primary surface, a first vertical conductive region that is electrically connected to the first horizontally-oriented doped region and the buried conductive region, and a first trench capacitor structure including a first capacitor electrode including the first vertical conductive region, a capacitor dielectric layer within the first trench, and a second capacitor electrode within the first trench. The electronic device can still further include a second transistor structure including a second horizontally-oriented doped region adjacent to the primary surface; and a second vertical conductive region that is electrically connected to the second horizontally-oriented doped region and the buried conductive region, wherein the second vertical conductive region is not part of any trench capacitor structure having a capacitor dielectric layer.

Item 12. The electronic device of Item 11, wherein the semiconductor layer further defines a second trench having a sidewall, wherein the second trench is adjacent to the primary surface and extends toward the buried conductive region, and the second vertical conductive region includes a second vertical conductive structure that substantially completely fills a remaining portion of the second trench.

Item 13. The electronic device of Item 12, wherein the first vertical conductive region includes a first vertical conductive structure that only partly, and not completely, fills the first trench.

Item 14. The electronic device of Item 11, wherein the first and second transistor structures are power transistors.

Item 15. A process of forming an electronic device can include providing a workpiece including a buried conductive region and a semiconductor layer over the buried conductive region, wherein the semiconductor layer has a primary surface and an opposing surface, and wherein the buried conductive region is disposed closer to the opposing surface than to the primary surface. The process can further include forming a gate electrode of a transistor structure, and forming a trench capacitor structure after forming the gate electrode, wherein the trench capacitor is electrically connected to the buried conductive region and a current-carrying electrode of the transistor structure.

Item 16. The process of Item 15, further including forming a conductive electrode adjacent to the primary surface, wherein forming the gate electrode is performed after forming the conductive electrode.

Item 17. The process of Item 15, wherein forming the trench capacitor structure includes patterning the semiconductor layer to define a trench adjacent to the primary surface and extending toward the buried conductive region, forming a capacitor dielectric layer within the trench, and forming a first capacitor electrode within the trench after forming the capacitor dielectric layer.

Item 18. The process of Item 17, wherein the forming the trench capacitor structure further includes forming a second capacitor electrode within the trench before forming the capacitor dielectric layer.

Item 19. The process of Item 18, further including forming a horizontally-oriented doped region adjacent to the primary surface, the trench, and the second capacitor electrode.

Item 20. The process of Item 17, wherein forming the trench capacitor structure further includes forming a second capacitor electrode that includes a doped portion of the semiconductor layer that extends to the buried conductive region.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:
1. An electronic device comprising:
a buried conductive region;
a semiconductor layer having a primary surface and an opposing surface, wherein the buried conductive region is disposed closer to the opposing surface than to the primary surface, and the semiconductor layer defines a first trench having a sidewall and being adjacent to the primary surface and extending toward the buried conductive region;

a first horizontally-oriented doped region adjacent to the primary surface, wherein the first horizontally-oriented doped region is at least part of a drain region or a collector of a first transistor structure;

a first insulating layer overlying the first horizontally-oriented doped region;

a conductive electrode overlying the first insulating layer;

a first capacitor structure including:
  a first capacitor electrode including a first vertical conductive region adjacent to the sidewall of the first trench and extending toward the buried conductive region, wherein the vertical conductive region is electrically connected to the first horizontally-oriented doped region and the buried conductive region;
  a capacitor dielectric layer; and
  a second capacitor electrode within the first trench, wherein the first capacitor structure is spaced apart from and does not underlie the conductive electrode, and wherein the electronic device comprises a power transistor.

2. The electronic device of claim 1, wherein the first capacitor electrode is disposed between the capacitor dielectric layer and the sidewall of the first trench.

3. The electronic device of claim 1, wherein the first capacitor dielectric layer abuts the sidewall of the first trench.

4. The electronic device of claim 1, further comprising:
  a gate electrode or a base region of the first transistor structure; and
  a source region or an emitter of the first transistor structure, wherein the conductive electrode is electrically connected to the source or emitter region.

5. The electronic device of claim 1, wherein the capacitor dielectric layer comprises a nitride film.

6. The electronic device of claim 5, wherein the capacitor dielectric layer further comprises an oxide film.

7. The electronic device of claim 6, wherein the oxide film is disposed between the first capacitor electrode and the nitride film.

8. The electronic device of claim 1, wherein:
  the conductive electrode has a first portion that lies substantially along a first plane and a second portion having a height that is substantially perpendicular to the first plane; and
  the second capacitor electrode has an uppermost location at an elevation higher than a highest elevation of the first portion of the conductive electrode.

9. The electronic device of claim 8, wherein a same conductive plug abuts the second capacitor electrode and the second portion of the conductive electrode.

10. The electronic device of claim 4, further comprising:
  a second transistor structure including a second horizontally-oriented doped region adjacent to the primary surface; and
  a vertical conductive region that is electrically connected to the second horizontally-oriented doped region and the buried conductive region, wherein the vertical conductive region is not part of any trench capacitor structure having a capacitor dielectric layer.

11. The electronic device of claim 10, wherein:
  the semiconductor layer further defines a second trench having a sidewall, wherein the second trench is adjacent to the primary surface and extends toward the buried conductive region; and the vertical conductive region comprises a vertical conductive structure that substantially completely fills a remaining portion of the second trench.

12. The electronic device of claim 11, wherein the first capacitor electrode only partly, and not completely, fills the first trench.

13. The electronic device of claim 10, wherein the first and second transistor structures are at least part of power transistors.

14. A process of forming an electronic device comprising:
  providing a workpiece including a buried conductive region and a semiconductor layer over the buried conductive region, wherein the semiconductor layer has a primary surface and an opposing surface, and wherein the buried conductive region is disposed closer to the opposing surface than to the primary surface;
  forming a horizontally-oriented doped region adjacent to the primary surface, wherein the horizontally-oriented doped region is at least part of a drain region or a collector of a transistor structure;
  forming a conductive electrode adjacent to the primary surface;
  forming a gate electrode of a transistor structure; and
  forming a trench capacitor structure after forming the gate electrode, wherein the trench capacitor is electrically connected to the buried conductive region and a current-carrying electrode of the transistor structure, and wherein the trench capacitor is spaced apart from the conductive electrode.

15. The process of claim 14, wherein forming the trench capacitor structure comprises:
  patterning the semiconductor layer to define a trench adjacent to the primary surface and extending toward the buried conductive region;
  forming a capacitor dielectric layer within the trench; and
  forming a first capacitor electrode within the trench after forming the capacitor dielectric layer.

16. The process of claim 15, wherein the forming the trench capacitor structure further comprises forming a second capacitor electrode within the trench before forming the capacitor dielectric layer.

17. The process of claim 16, wherein the horizontally-oriented doped region is formed adjacent to the trench and the second capacitor electrode.

18. The process of claim 15, wherein forming the trench capacitor structure further comprises forming a second capacitor electrode that includes a doped portion of the semiconductor layer that extends to the buried conductive region.

19. An electronic device comprising:
  a buried conductive region;
  a semiconductor layer having a primary surface and an opposing surface, wherein the buried conductive region is disposed closer to the opposing surface than to the primary surface, and the semiconductor layer defines a first trench having a sidewall and being adjacent to the primary surface and extending toward the buried conductive region;
  a first horizontally-oriented doped region adjacent to the primary surface;
  a first insulating layer overlying the first horizontally-oriented doped region;
  a conductive electrode overlying the first insulating layer;
  a first capacitor structure including:
    a first capacitor electrode including a first vertical conductive region adjacent to the sidewall of the first trench and extending toward the buried conductive region, wherein the vertical conductive region is electrically connected to the first horizontally-oriented doped region and the buried conductive region;

a capacitor dielectric layer; and a second capacitor electrode within the first trench, wherein:

the first capacitor structure is spaced apart from and does not underlie the conductive electrode;

the conductive electrode has a first portion that lies substantially along a first plane and a second portion having a height that is substantially perpendicular to the first plane; and the second capacitor electrode has an uppermost location at an elevation higher than a highest elevation of the first portion of the conductive electrode.

* * * * *